US012669380B2

(12) United States Patent
Fujikane et al.

(10) Patent No.: US 12,669,380 B2
(45) Date of Patent: Jun. 30, 2026

(54) INFRARED SENSOR

(71) Applicant: Panasonic Intellectual Property Management Co., Ltd., Osaka (JP)

(72) Inventors: Masaki Fujikane, Osaka (JP); Kouhei Takahashi, Osaka (JP); Naoki Tambo, Kyoto (JP); Yasuyuki Naito, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 284 days.

(21) Appl. No.: 18/327,935

(22) Filed: Jun. 2, 2023

(65) Prior Publication Data

US 2023/0309407 A1 Sep. 28, 2023

Related U.S. Application Data

(63) Continuation of application No. PCT/JP2021/045643, filed on Dec. 10, 2021.

(30) Foreign Application Priority Data

Dec. 25, 2020 (JP) ................................ 2020-217808

(51) Int. Cl.
*G01J 5/02* (2022.01)
*G01J 5/12* (2006.01)
(Continued)

(52) U.S. Cl.
CPC ................. *G01J 5/023* (2013.01); *G01J 5/12* (2013.01); *G01J 5/20* (2013.01); *H10N 10/17* (2023.02)

(58) Field of Classification Search
CPC .... G01J 5/023; G01J 5/046; G01J 5/12; G01J 5/14; G01J 5/20; G01J 5/22; H10N 10/17; H10N 10/82; H10N 10/8556
See application file for complete search history.

(56) References Cited

U.S. PATENT DOCUMENTS 8,054,145 B2 * 11/2011 Mohammadi .......... H10N 30/40
                                                        333/248
8,094,023 B1 * 1/2012 El-Kady ................ G08B 13/14
                                                        340/568.1
(Continued)

FOREIGN PATENT DOCUMENTS

JP        2017-223644           12/2017
KR        20140009182 A    *   1/2014
WO        2019/225058           11/2019

OTHER PUBLICATIONS

International Search Report of PCT application No. PCT/JP2021/045643 dated Jan. 11, 2022.
(Continued)

*Primary Examiner* — Thomas R Artman
(74) *Attorney, Agent, or Firm* — Rimon P.C.

(57) ABSTRACT

An infrared sensor includes a base substrate, an infrared light receiver, and a beam. The beam includes a separated portion separated from the base substrate to be suspended above the base substrate. The beam is connected at the separated portion to the infrared light receiver. The beam includes a p-type portion containing a p-type semiconductor and an n-type portion containing an n-type semiconductor. The p-type portion has a first three-dimensional structure including first recesses and a first solid portion formed between the first recesses. The first solid portion has, between the first recesses adjacent to each other in plan view, a smallest dimension of less than or equal to 100 nanometers in plan view. The n-type portion has a second three-dimensional structure including second recesses and a second solid portion formed between the second recesses. The second solid portion has, between the second recesses adjacent to each other in plan view, a smallest dimension of less than or equal to 100 nanometers in plan view. The beam satisfies at least one of following conditions (Ia) or (IIa): (Ia) the first
(Continued)

solid portion includes a first portion having a Young's modulus of less than or equal to 80% of a Young's modulus of a first reference sample that is made of a material of a type identical to a type of a material constituting the first solid portion and that does not have recesses; and (IIa) the second solid portion includes a second portion having a Young's modulus of less than or equal to 80% of a Young's modulus of a second reference sample that is made of a material of a type identical to a type of a material constituting the second solid portion and that does not have recesses.

20 Claims, 15 Drawing Sheets

(51) Int. Cl.
  G01J 5/20 (2006.01)
  H10N 10/17 (2023.01)

(56) References Cited

U.S. PATENT DOCUMENTS

| | | | | |
|---|---|---|---|---|
| 8,508,370 | B1 * | 8/2013 | El-Kady | H10N 10/857 |
| | | | | 340/568.1 |
| 9,006,857 | B1 * | 4/2015 | Carr | G01J 5/12 |
| | | | | 257/209 |
| 9,595,653 | B2 * | 3/2017 | Mitrovic | H10N 10/01 |
| 10,281,333 | B2 * | 5/2019 | Takahashi | G01J 5/06 |
| 10,605,667 | B2 * | 3/2020 | Kawasaki | H10N 10/17 |
| 10,663,350 | B1 * | 5/2020 | Wollack | G01J 5/06 |
| 10,890,489 | B2 * | 1/2021 | Tambo | G01J 5/14 |
| 11,320,313 | B2 * | 5/2022 | Kawasaki | G01J 5/20 |
| 11,906,363 | B2 * | 2/2024 | Takahashi | G01J 5/024 |
| 11,917,916 | B2 * | 2/2024 | Fujikane | H10N 10/17 |
| 12,007,283 | B2 * | 6/2024 | Takahashi | G01J 5/20 |
| 12,156,471 | B2 * | 11/2024 | Fujikane | C01B 33/02 |
| 12,167,691 | B2 * | 12/2024 | Fujikane | H10N 10/82 |
| 12,167,692 | B2 * | 12/2024 | Fujikane | H10N 10/82 |
| 2009/0295505 | A1 * | 12/2009 | Mohammadi | H10N 30/40 |
| | | | | 333/191 |
| 2012/0282435 | A1 * | 11/2012 | Yang | C01B 33/021 |
| | | | | 252/500 |
| 2013/0255738 | A1 * | 10/2013 | Mitrovic | H10N 10/17 |
| | | | | 438/510 |
| 2017/0047499 | A1 | 2/2017 | Hussein | |
| 2017/0069818 | A1 | 3/2017 | Mitrovic et al. | |
| 2017/0238804 | A1 * | 8/2017 | Hartley | G02B 1/005 |
| 2017/0356806 | A1 | 12/2017 | Takahashi et al. | |
| 2019/0178718 | A1 * | 6/2019 | Kawasaki | G01J 5/06 |
| 2020/0003625 | A1 | 1/2020 | Tambo et al. | |
| 2020/0191658 | A1 * | 6/2020 | Kawasaki | G01J 5/06 |
| 2021/0302236 | A1 * | 9/2021 | Takahashi | G01J 5/20 |
| 2021/0302237 | A1 * | 9/2021 | Takahashi | H10F 71/10 |
| 2021/0313504 | A1 * | 10/2021 | Fujikane | B32B 7/027 |
| 2021/0313505 | A1 * | 10/2021 | Fujikane | H10N 10/17 |
| 2022/0216387 | A1 * | 7/2022 | Fujikane | H10N 10/82 |
| 2022/0216388 | A1 * | 7/2022 | Fujikane | H10N 10/82 |
| 2023/0309407 | A1 * | 9/2023 | Fujikane | G01J 5/22 |
| 2023/0313936 | A1 * | 10/2023 | Fujikane | H10N 10/01 |
| | | | | 428/131 |
| 2024/0011840 | A1 * | 1/2024 | Ohura | G01J 5/10 |
| 2024/0060824 | A1 * | 2/2024 | Takahashi | H10F 39/184 |
| 2024/0068875 | A1 * | 2/2024 | Takahashi | H10N 10/853 |
| 2024/0264004 | A1 * | 8/2024 | Tambo | H10N 19/00 |
| 2024/0276882 | A1 * | 8/2024 | Carr | H10N 19/101 |
| 2025/0237550 | A1 * | 7/2025 | Nakamura | H10N 10/13 |

OTHER PUBLICATIONS

Dariusz Chrobak et al., "Deconfinement leads to changes in the nanoscale plasticity of silicon", Nature Nanotechnology, Aug. 2011, vol. 6, Jul. 24, 2011, pp. 480-484.

Graham L. W. Cross, "Isolation leads to change", Nature Nanotechnology, Aug. 2011, vol. 6, Aug. 4, 2011, pp. 467-468.

M. Nomura et al., "Impeded thermal transport in Si multiscale hierarchical architectures with phononic crystal nanostructures", Physical Review B 91, May 15, 2015, 205422.

Tereza Uhlirova et al., "Conductivity and Young's modulus of porous metamaterials based on Gibson-Ashby cells", Scripta Materialia, vol. 159, Sep. 7, 2018, pp. 1-4.

* cited by examiner

INFRARED SENSOR

BACKGROUND

1. Technical Field

The present disclosure relates to an infrared sensor.

2. Description of the Related Art

In the field of thermal infrared sensors, a structure in which a beam is used to separate an infrared light receiver from a base substrate has been proposed. This structure is intended to thermally insulate the infrared light receiver from the base substrate. In a thermal infrared sensor that has this structure, the higher the heat insulation performance of the beam, the more the sensitivity to infrared light is improved.

U.S. Patent Application Publication No. 2017/0047499, U.S. Patent Application Publication No. 2017/0069818, and Nomura et al., "Impeded thermal transport is Si multiscale hierarchical architectures with phononic crystal nanostructures", Physical ReviewB 91, 205422 (2015) each disclose a periodic structure that includes through holes and decreases the thermal conductivity of a thin film. In this periodic structure, the through holes are arranged regularly at a periodic interval of nanometer-order in a region from 1 nanometer (nm) to 1000 nm in plan view of the thin film. This periodic structure is a phononic crystal structure of a type. The phononic crystal structure of this type is a periodic structure in which the smallest unit that constitutes the arrangement of the through holes is a unit lattice. The thermal conductivity of a thin film can be reduced by, for example, forming the thin film to be porous. This is because the thermal conductivity of the thin film is decreased by gaps that are introduced in the thin film as a result of the thin film being formed to be porous. Meanwhile, with the phononic crystal structure, the thermal conductivity of a base material itself that constitutes the thin film can be reduced. Therefore, the thermal conductivity is expected to be further reduced compared with when the thin film is simply formed to be porous.

Japanese Unexamined Patent Application Publication No. 2017-223644 discloses an infrared sensor in which a beam that has a phononic crystal structure is used.

SUMMARY

The aforementioned technology has a room for reexamination to increase the sensitivity of the infrared sensor.

One non-limiting and exemplary embodiment of the present disclosure thus provides technologies that are advantageous from the point of view of increasing the sensitivity of an infrared sensor.

In one general aspect of the present disclosure, the technologies disclosed here feature the following infrared sensor.

An infrared sensor includes a base substrate, an infrared light receiver, and a beam. The beam includes a separated portion that is separated from the base substrate so as to be suspended above the base substrate. The beam is connected at the separated portion to the infrared light receiver. The beam includes a p-type portion that contains a p-type semiconductor and an n-type portion that contains an n-type semiconductor. The p-type portion has a first three-dimensional structure that includes first recesses and a first solid portion formed between the first recesses. The first solid portion has, between the first recesses adjacent to each other in plan view, a smallest dimension of less than or equal to 100 nanometers in plan view. The n-type portion has a second three-dimensional structure that includes second recesses and a second solid portion formed between the second recesses. The second solid portion has, between the second recesses adjacent to each other in plan view, a smallest dimension of less than or equal to 100 nanometers in plan view.

The infrared sensor according to the present disclosure is advantageous from the point of view of high sensitivity.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1A:
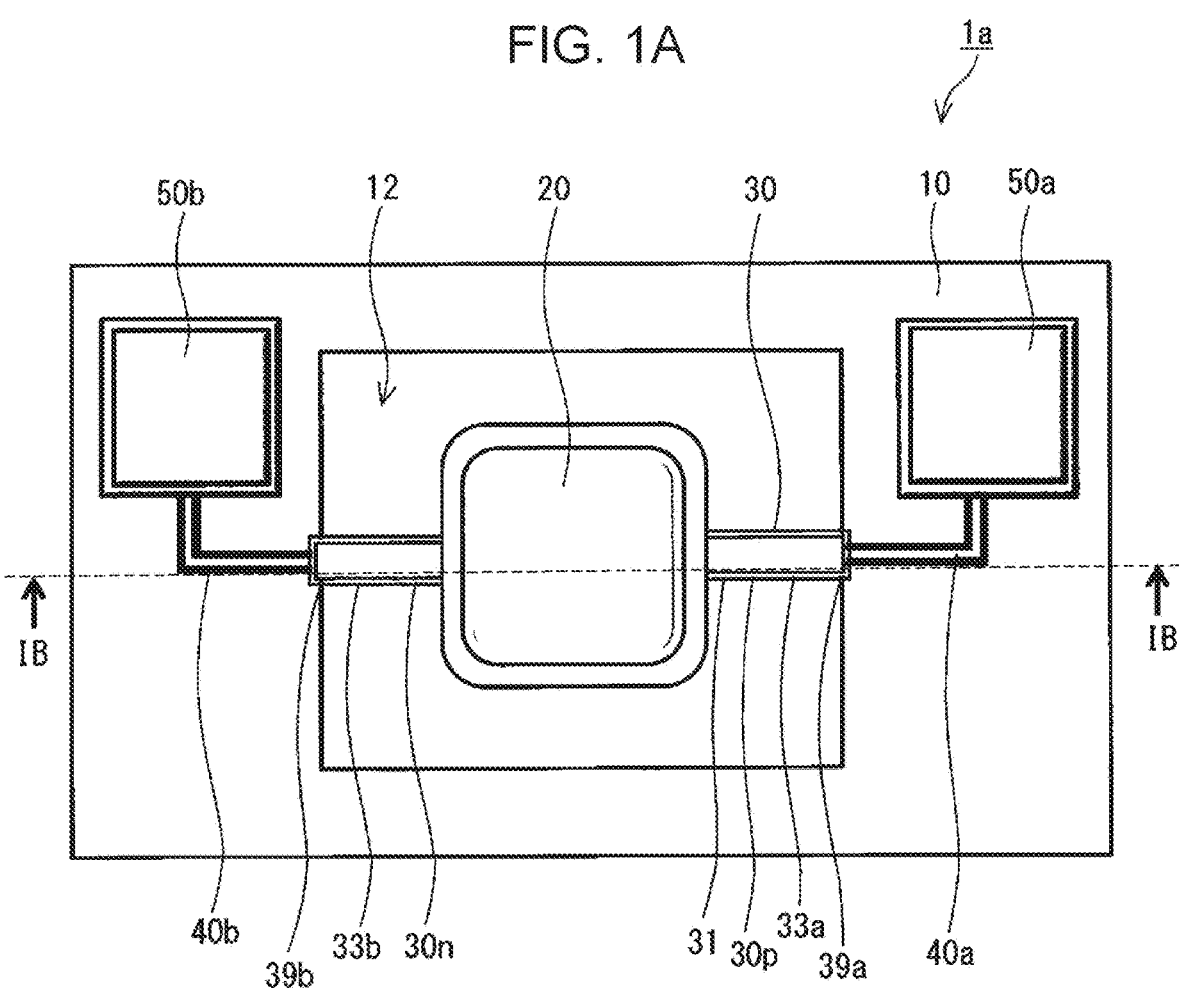
FIG. 1A is a plan view schematically illustrating an infrared sensor according to Embodiment 1.

Underlying Knowledge Forming Basis of the Present Disclosure

In solid materials of an insulator, a semiconductor, and the like, heat is mainly carried by lattice vibrations called phonons. The thermal conductivity of the solid materials of the insulator, the semiconductor, and the like is determined by a dispersion relation of the phonons in the solid materials. The dispersion relation of the phonons includes a relationship between frequency and wave number or a band structure. In the solid materials of the insulator, the semiconductor, and the like, the frequency band of the phonons that carry the heat extends in a wide range from 100 GHz to 10 THz. This frequency band is a band of heat. The thermal conductivity of the solid materials is determined by a dispersion relation of phonons in the band of heat.

For example, in a phononic crystal structure, a dispersion relation of phonons included in a material can be adjusted by a periodic structure of through holes. In other words, with the phononic crystal structure, the thermal conductivity itself of a material, such as the base material of a thin film, can be adjusted. In particular, by forming a phononic band gap (PBG) with the phononic crystal structure, it is possible to greatly reduce the thermal conductivity of a material. Phonons are not able to be present in a PBG. Therefore, a PBG that is formed in accordance with the band of heat may become a barrier to heat conduction. In addition, the gradient of a dispersion curve of phonons is reduced by the PBG also in a frequency band other than a band corresponding to the PBG. Consequently, the group velocity of the phonons decreases, and heat conduction velocity of a material decreases. These matters greatly contribute to a reduction in the thermal conductivity of the material.

According to the examination performed by the present inventors, reducing the elastic modulus, which is considered as a physical property value unique to a material, is effective to reduce the group velocity of phonons. For example, it is considered that high heat insulation performance can be imparted to a solid material if technology that is capable of reducing the elastic modulus of a solid material including materials of the same type can be developed. However, such technique has not been developed as far as the present inventors know.

According to G. L. W. Cross, "Isolation leads to change", Nature Nanotech 6, 467-4 68 (2011) and D. Chrobak et al, "Deconfinement leads to changes in the nanoscale plasticity of silicon", Nature Nanotech 6, 480-484 (2011), it is shown that the mechanical properties of Si (silicon) differ from those in a bulk state in a structure of a nanometer size. For example, it has been reported that mechanical behavior relating to plastic deformation or phase transformation of Si nanoparticles having diameters from 134 nm to 338 nm or Si nanoparticles having diameters less than or equal to 114 nm changes compared to a Si material in a bulk state.

In consideration of the aforementioned reported examples, the present inventors have conceived of an idea that a solid material that has a predetermined structure may reduce the elastic modulus in an elastic deformation region that is in a stage before reaching plastic deformation, and that the reduction in the elastic modulus may also affect the thermal conductivity of the solid material. In addition, the present inventors have conceived that it may be possible to increase the sensitivity of an infrared sensor by providing a beam of the infrared sensor with such a structure. Through repeated trial and error based on such an idea, the present inventors have eventually devised the infrared sensor according to the present disclosure.

Outline of One Aspect According to Present Disclosure

The present disclosure provides the following infrared sensor.

An infrared sensor that includes:

a base substrate;

an infrared light receiver; and a beam, in which the beam includes a separated portion that is separated from the base substrate so as to be suspended above the base substrate, and the beam is connected at the separated portion to the infrared light receiver, in which the beam includes a p-type portion that contains a p-type semiconductor and an n-type portion that contains an n-type semiconductor, in which the p-type portion has a first three-dimensional structure that includes first recesses and a first solid portion formed between the first recesses, the first solid portion having, between the first recesses adjacent to each other in plan view, a smallest dimension of less than or equal to 100 nanometers in plan view, and in which the n-type portion has a second three-dimensional structure that includes second recesses and a second solid portion formed between the second recesses, the second solid portion having, between the second recesses adjacent to each other in plan view, a smallest dimension of less than or equal to 100 nanometers in plan view.

The aforementioned infrared sensor tends to have high sensitivity due to the beam that is configured as described above.

Embodiments of Present Disclosure

Hereinafter, embodiments of the present disclosure will be described with reference to the drawings. The embodiments described below each indicate a comprehensive or specific example. Numerical values, shapes, materials, components, arrangement positions and connection forms of the components, process conditions, steps, the order of the steps, and the like indicated in the following embodiments are examples and not intended to limit the present disclosure. Among the components in the following embodiments, components that are not described in the independent claims defining the most generic concept are described as optional components. Note that the drawings are schematic views, which are not necessarily exactly illustrated.

Embodiment 1

Figure 1B:
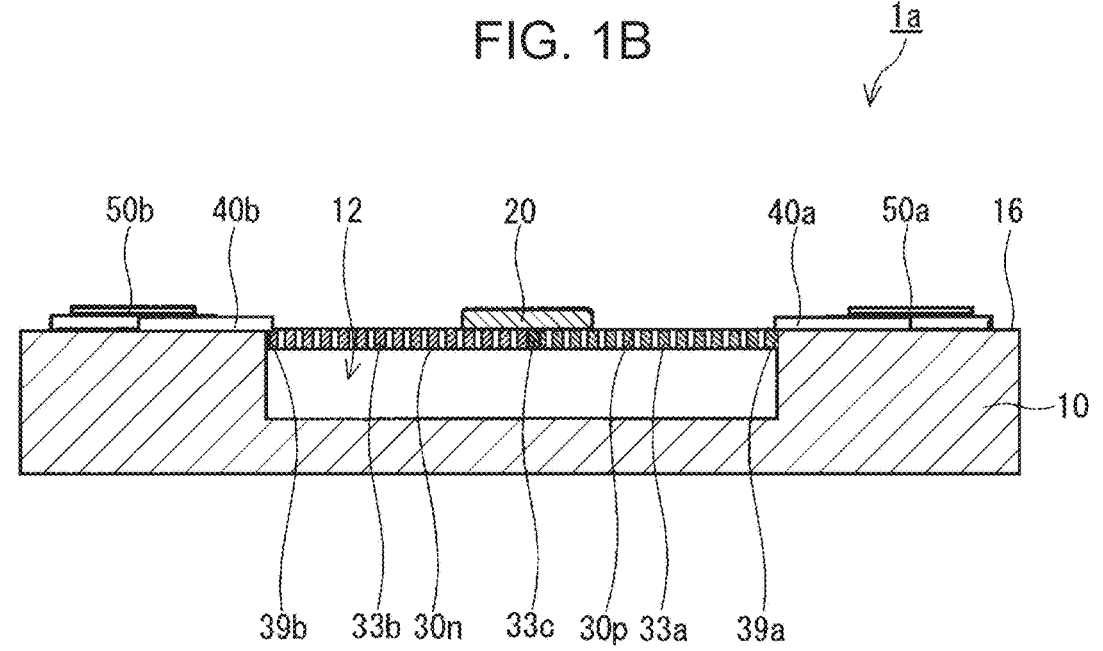
FIG. 1B is a sectional view of the infrared sensor in FIG. 1A taken along line IB-IB.
Figure 2A:
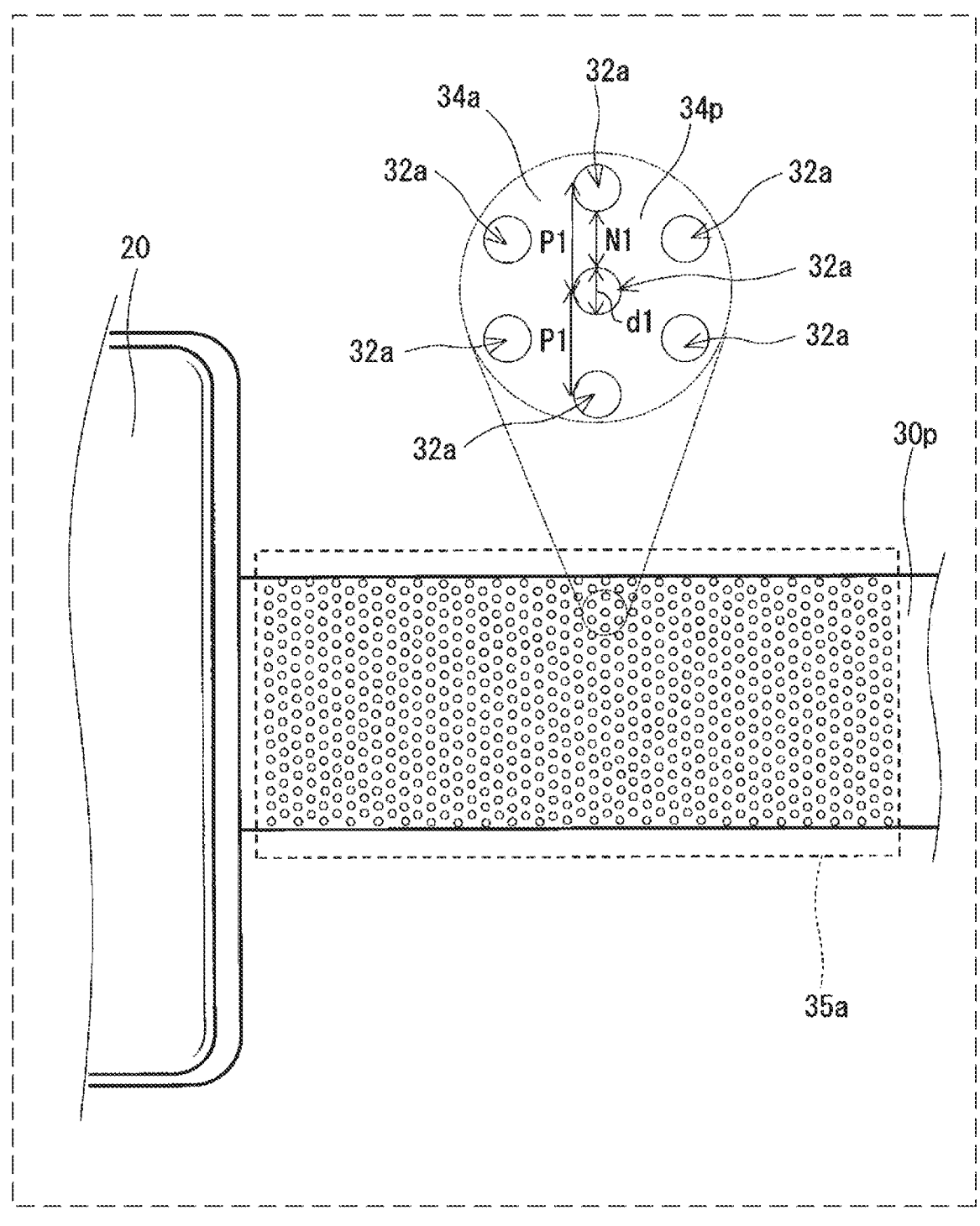
FIG. 2A is a plan view illustrating a portion of the infrared sensor in FIG. 1A.
Figure 2B:
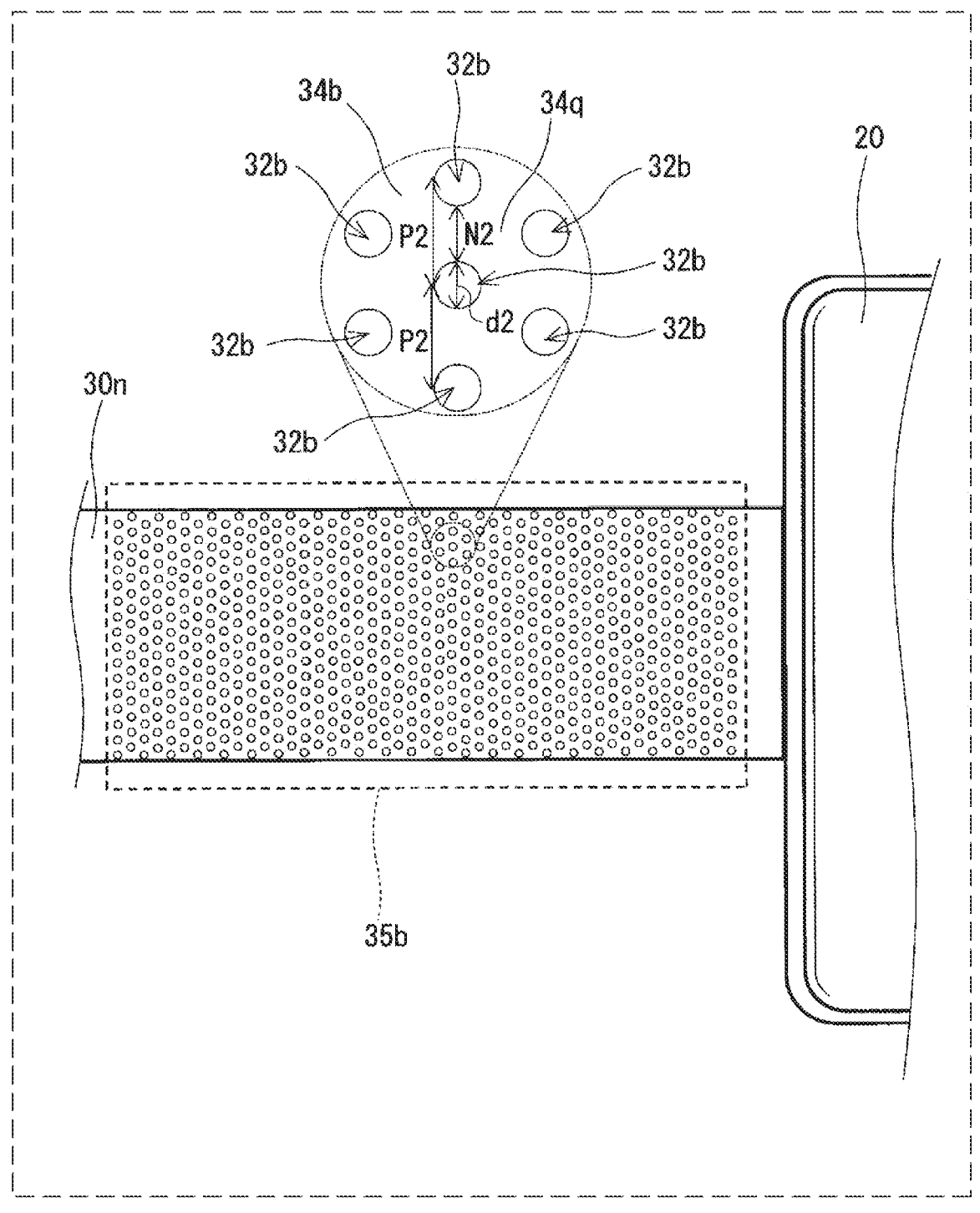
FIG. 2B is a plan view illustrating another portion of the infrared sensor in FIG. 1A.

FIG. 1A and FIG. 1B illustrate an infrared sensor $1a$ according to Embodiment 1. The infrared sensor $1a$ includes a base substrate $10$, an infrared light receiver $20$, and a beam $30$. The beam $30$ includes a separated portion $31$ that is separated from the base substrate $10$ so as to be suspended above the base substrate $10$. In addition, the beam $30$ is connected at the separated portion $31$ to the infrared light receiver $20$. The beam $30$ includes a p-type portion $30p$ containing a p-type semiconductor and an n-type portion $30n$ containing an n-type semiconductor. FIG. 2A and FIG. 2B are a plan view illustrating the p-type portion $30p$ and a plan view illustrating the n-type portion $30n$, respectively. As illustrated in FIG. 2A, the p-type portion $30p$ has a first three-dimensional structure $35a$. The first three-dimensional structure $35a$ includes first recesses $32a$ and a first solid portion $34a$ formed between the first recesses $32a$. A smallest dimension N1 of the first solid portions $34a$ in plan view between the first recesses $32a$ adjacent to each other in plan view is less than or equal to 100 nm. For example, in plan view, a shortest distance between a specific one of the first recesses $32a$ and another one of the first recesses $32a$ located closest to the specific first recess $32a$ corresponds to the smallest dimension N1. As illustrated in FIG. 2B, the n-type portion $30n$ has a second three-dimensional structure $35b$. The second three-dimensional structure $35b$ includes second recesses $32b$ and a second solid portion $34b$ formed between the second recesses $32b$. A smallest dimension N2 of the second solid portion $34b$ in plan view between the second recesses $32b$ adjacent to each other in plan view is less than or equal to 100 nm. For example, in plan view, a shortest distance between a specific one of the second recesses $32b$ and another one of the second recesses $32b$ located closest to the specific second recess $32b$ corresponds to the smallest dimension N2. In the present specification, the "plan view" means that an object is viewed in a direction perpendicular to a main surface of the object. The "main surface" means a surface having a widest area in the object.

Due to the smallest dimension N1 of the first solid portion $34a$ in plan view being less than or equal to 100 nm, the p-type portion $30p$ tends to have high heat-insulating properties. This is because the elastic modulus of a predetermined portion of the first solid portion $34a$ of the first three-dimensional structure $35a$ tends to be low, and the thermal conductivity of the p-type portion $30p$ also tends to be low. In addition, due to the smallest dimension N2 of the second solid portion $34b$ in plan view being less than or equal to 100 nm, the n-type portion $30n$ tends to have high heat-insulating properties. This is because the elastic modulus of a predetermined portion of the second solid portion $34b$ of the second three-dimensional structure $35b$ tends to be low, and the thermal conductivity of the n-type portion $30n$ also tends to be low. Therefore, the p-type portion $30p$ and the n-type portion $30n$ tend to have high heat-insulating properties. As a result, the sensitivity of the infrared sensor $1a$ tends to be high. In the present specification, the elastic modulus means the young's modulus.

The smallest dimension N1 of the first solid portion $34a$ in plan view may be less than or equal to 90 nm, may be less than or equal to 85 nm, and may be less than or equal to 80 nm. The smallest dimension N1 may be less than or equal to 70 nm, may be less than or equal to 60 nm, may be less than or equal to 50 nm, and may be less than or equal to 40 nm. The smallest dimension N1 is, for example, more than or equal to 1 nm.

The smallest dimension N2 of the second solid portion $34b$ in plan view may be less than or equal to 90 nm, may be less than or equal to 85 nm, and may be less than or equal to 80 nm. The smallest dimension N2 may be less than or equal to 70 nm, may be less than or equal to 60 nm, may be less than or equal to 50 nm, and may be less than or equal to 40 nm. The smallest dimension N2 is, for example, more than or equal to 1 nm.

The beam $30$ satisfies, for example, at least one of the following conditions (Ia) or (IIa). Consequently, the thermal conductivity of the p-type portion $30p$ and the n-type portion $30n$ tends to be low more reliably, and the heat-insulating properties of these portions tend to be high. The beam $30$ may satisfy both of the conditions (Ia) and (IIa).

(Ia) The first solid portion $34a$ includes a first portion $34p$ having an elastic modulus Ep of less than or equal to 80% of an elastic modulus Er1 of a first reference sample that is made of a material of a type identical to the type of a material constituting the first solid portion $34a$ and that does not have recesses.

(IIa) The second solid portion $34b$ includes a second portion $34q$ having an elastic modulus Eq of less than or equal to 80% of an elastic modulus Er2 of a second reference sample that is made of a material of a type identical to the type of a material constituting the second solid portion $34b$ and that does not have recesses.

The first portion $34p$ is located, for example, between the first recesses $32a$. The second portion $34q$ is located, for example, between the second recesses $32b$.

The elastic modulus Er1, the elastic modulus Ep, the elastic modulus Er2, and the elastic modulus Eq are determined by, for example, a nanoindentation method. As test conditions for the nanoindentation method, for example, the conditions described in examples can be employed. The first reference sample is formed, for example, in the same manner as the p-type portion $30p$ except that the first reference sample does not have recesses. The second reference sample is formed, for example, in the same manner as the n-type portion $30n$ except that the second reference sample does not have recesses.

The elastic modulus Ep of the first portion $34p$ may be less than or equal to 75%, less than or equal to 70%, less than or equal to 65%, less than or equal to 60%, less than or equal to 50%, or less than or equal to 40% of the elastic modulus Er1. The elastic modulus Ep of the first portion $34p$ is, for example, more than or equal to 10% of the elastic modulus Er1 and may be more than or equal to 15%, more than or equal to 20%, more than or equal to 25%, or more than or equal to 30% of the elastic modulus Er1.

The elastic modulus Eq of the second portion $34q$ may be less than or equal to 75%, less than or equal to 70%, less than or equal to 65%, less than or equal to 60%, less than or equal to 50%, or less than or equal to 40% of the elastic modulus Er2. The elastic modulus Eq of the second portion $34q$ is, for example, more than or equal to 10% of the elastic modulus Er2 and may be more than or equal to 15%, more than or equal to 20%, more than or equal to 25%, or more than or equal to 30% of the elastic modulus Er2.

Substances contained in the first portion $34p$ and the second portion $34q$ are not limited to substances of specific types. The first solid portion $34a$ and the second solid portion $34b$ may be formed with a monocrystalline substance, may be formed with a polycrystalline substance, and may be formed with an amorphous substance. The beam 30 satisfies, for example, at least one of the following conditions (Ib) or (IIb). Silicon may be monocrystalline, may be polycrystalline, and may be amorphous. The beam 30 may satisfy both of the following conditions (Ib) and (IIb).

(Ib) The first portion $34p$ of the first solid portion $34a$ contains silicon and has an elastic modulus of less than or equal to 100 GPa.

(IIb) The second portion $34q$ of the second solid portion $34b$ contains silicon and has an elastic modulus of less than or equal to 100 GPa.

The beam 30 satisfies, for example, at least one of the following conditions (If) or (IIf). In this case, the elastic moduli at locations around the first recesses $32a$ or the second recesses $32b$ tend to vary greatly. Such variations in the elastic moduli can effectively contribute to a reduction in the thermal conductivity of the p-type portion $30p$ or the n-type portion $30n$. These portions thus tend to have high heat insulation performance more reliably.

(If) The first solid portion $34a$ has different first elastic moduli at locations around a specific one of the first recesses $32a$ in plan view of the first three-dimensional structure $35a$. The first elastic moduli include a value whose difference from a largest value of the first elastic moduli is more than or equal to 10% of the largest value of the first elastic moduli.

(IIf) The second solid portion $34b$ has different elastic moduli at locations around a specific one of the second recesses $32b$ in plan view of the second three-dimensional structure $35b$. The second elastic moduli include a value whose difference from a largest value of the second elastic moduli is more than or equal to 10% of the largest value of the second elastic moduli.

The beam 30 has a thickness of, for example, more than or equal to 10 nm and less than or equal to 500 nm. The beam 30 is, for example, rectangular in plan view. The thickness of the beam 30 may be more than or equal to 20 μm, may be more than or equal to 30 μm, may be more than or equal to 40 μm, and may be more than or equal to 50 μm. The thickness of the beam 30 may be more than or equal to 60 μm. The thickness of the beam 30 may be less than or equal to 400 nm and may be less than or equal to 300 nm.

The first three-dimensional structure $35a$ and the second three-dimensional structure $35b$ are each, for example, a phononic crystal. As illustrated in FIG. 2A and FIG. 2B, the first recesses $32a$ in the first three-dimensional structure $35a$ and the second recesses $32b$ in the second three-dimensional structure $35b$ are arranged, for example, regularly in an in-plane direction.

As illustrated in FIG. 2A, in plan view of the first three-dimensional structure $35a$, the first recesses $32a$ are arranged at a predetermined periodic interval P1. The periodic interval P1 is, for example, less than or equal to 300 nm. Consequently, the p-type portion $30p$ tends to have high heat insulation performance more reliably. As illustrated in FIG. 2B, in plan view of the second three-dimensional structure $35b$, the second recesses $32b$ are arranged at a predetermined periodic interval P2. The periodic interval P2 is, for example, less than or equal to 300 nm. Consequently, the n-type portion $30n$ tends to have high heat insulation performance more reliably.

The periodic interval P1 and the periodic interval P2 each may be less than or equal to 280 nm, may be less than or equal to 260 nm, may be less than or equal to 250 nm, and may be less than or equal to 200 nm. The periodic interval P1 and the periodic interval P2 are each, for example, more than or equal to 1 nm and each may be more than or equal to 5 nm and may be more than or equal to 10 nm.

The shapes of the first recesses $32a$ in plan view of the first three-dimensional structure $35a$ and the shapes of the second recesses $32b$ in plan view of the second three-dimensional structure $35b$ are not limited to specific shapes. The beam 30 satisfies, for example, at least one of the following conditions (Ic) or (IIc). As illustrated in FIG. 2A and FIG. 2B, the beam 30 may satisfy both of the conditions (Ic) and (IIc).

(Ic) The first recesses $32a$ are circular in plan view of the first three-dimensional structure $35a$.

(IIc) The second recesses $32b$ are circular in plan view of the second three-dimensional structure $35b$.

Figure 3A:
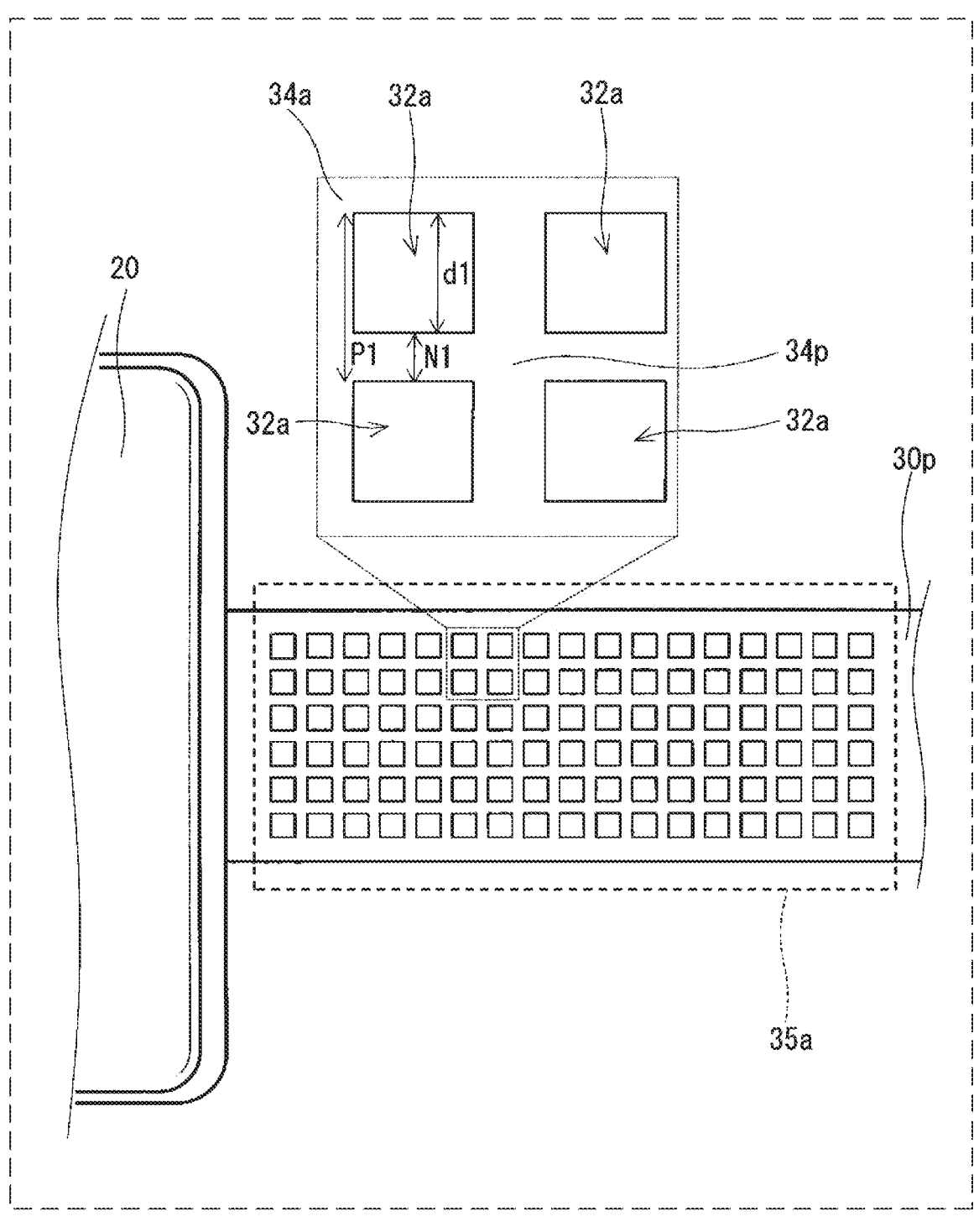
FIG. 3A is a plan view illustrating a portion of a modification of the infrared sensor according to Embodiment 1.
Figure 3B:
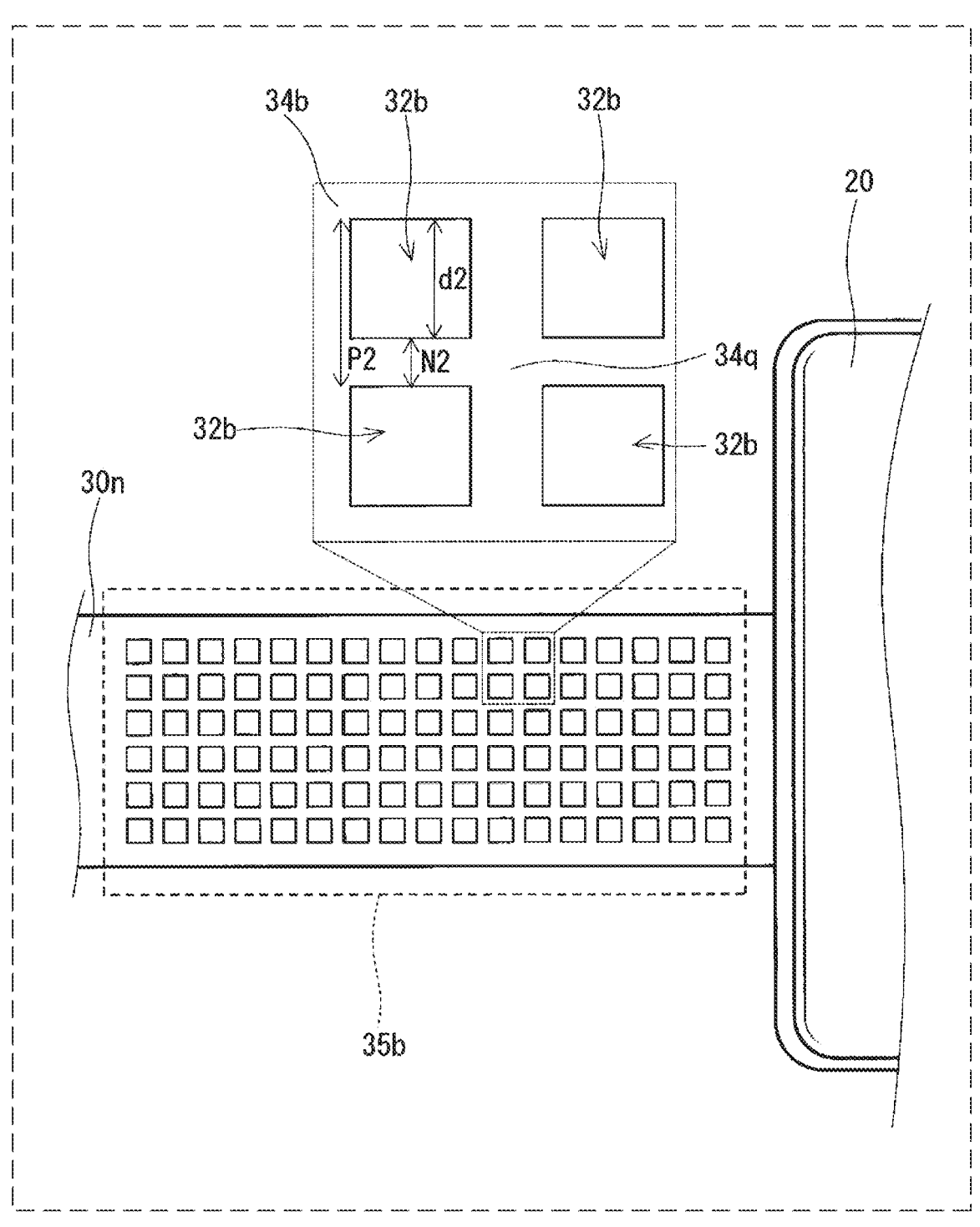
FIG. 3B is a plan view illustrating a portion of a modification of the infrared sensor according to Embodiment 1.

The beam 30 may satisfy, for example, at least one of the following conditions (Id) or (IId). Consequently, when the p-type portion $30p$ or the n-type portion $30n$ is rectangular in plan view, the first recesses $32a$ or the second recesses $32b$ are easily disposed in a wide range. FIG. 3A and FIG. 3B are plan views illustrating the p-type portion $30p$ and the n-type portion $30n$ in a modification of the infrared sensor $1a$. The modification is configured similarly to the infrared sensor $1a$ except for portions that will be particularly described. Components of the modification identical or corresponding to the components of the infrared sensor $1a$ are given identical reference signs and will not be described in detail. As illustrated in FIG. 3A and FIG. 3B, the beam 30 may satisfy both of the conditions (Id) and (IId).

(Id) The first recesses $32a$ are rectangular in plan view of the first three-dimensional structure $35a$.

(IId) The second recesses $32b$ are rectangular in plan view of the second three-dimensional structure $35b$.

The first recesses $32a$ are arranged, for example, at the periodic interval P1 in a specific direction. In plan view of the first three-dimensional structure $35a$, an opening of each of the first recesses $32a$ in a direction parallel to the specific direction has a predetermined dimension d1. The dimension d1 and the periodic interval P1 satisfy, for example, the relationship of $d1/P1 \geq 0.5$. The dimension d1 is, for example, more than or equal to 0.5 nm and less than or equal to 295 nm.

The second recesses $32b$ are arranged, for example, at the periodic interval P2 in a specific direction. In plan view of the second three-dimensional structure $35b$, an opening of each of the second recesses $32b$ in a direction parallel to the specific direction has a predetermined dimension d2. The dimension d2 and the periodic interval P2 satisfy, for example, the relationship of $d2/P2 \geq 0.5$. The dimension d2 is, for example, more than or equal to 0.5 nm and less than or equal to 295 nm.

As illustrated in FIG. 2A, for example, in plan view of the first three-dimensional structure $35a$, the regularly arranged first recesses $32a$ form a unit lattice. This unit lattice is not limited to a specific lattice. In plan view of the first three-dimensional structure $35a$, the unit lattice that is formed by the regularly arranged first recesses $32a$ is, for example, a hexagonal lattice. In plan view of the first three-dimensional structure $35a$, the unit lattice that is formed by the regularly arranged first recesses $32a$ may be a square lattice, may be a rectangular lattice, and may a face-centered rectangular lattice.

As illustrated in FIG. 2B, for example, in plan view of the second three-dimensional structure 35b, the regularly arranged second recesses 32b form a unit lattice. This unit lattice is not limited to a specific lattice. In plan view of the second three-dimensional structure 35b, the unit lattice that is formed by the regularly arranged second recesses 32b is, for example, a hexagonal lattice. In plan view of the second three-dimensional structure 35b, the unit lattice that is formed by the regularly arranged second recesses 32b may be a square lattice, may be a rectangular lattice, and may be a face-centered rectangular lattice.

As illustrated in FIG. 2A and FIG. 2B, the phononic crystal in the first three-dimensional structure 35a and the phononic crystal in the second three-dimensional structure 35b are each, for example, a monocrystal. The phononic crystal in the first three-dimensional structure 35a and the phononic crystal in the second three-dimensional structure 35b each may be, for example, a polycrystal. In this case, in plan view of the first three-dimensional structure 35a or the second three-dimensional structure 35b, the phononic crystal has domains, and a phononic crystal in each of the domains is a monocrystal. In other words, the phononic crystal in a polycrystalline state is a composite body of phononic monocrystals. In the domains, the first recesses 32a or the second recesses 32b are arranged regularly in different directions. The orientations of the unit lattice in the domains are the same. The shapes of the domains may be the same or different in plan view of the first three-dimensional structure 35a or the second three-dimensional structure 35b. The sizes of the domains may be the same or different in plan view of the first three-dimensional structure 35a or the second three-dimensional structure 35b.

When the phononic crystal in the first three-dimensional structure 35a or the phononic crystal in the second three-dimensional structure 35b is a polycrystal, the shapes of the domains in plan view are not limited to specific shapes. The shapes of the domains in plan view are, for example, polygonal shapes including a triangular shape, a square shape, and a rectangular shape, circular shapes, elliptic shapes, and composite shapes of these shapes. The shapes of the domains in plan view may be irregular shapes. The number of the domains included in the phononic crystal in the first three-dimensional structure 35a or the phononic crystal in the second three-dimensional structure 35b is not limited to a specific value.

When the phononic crystal in the first three-dimensional structure 35a or the phononic crystal in the second three-dimensional structure 35b is a polycrystal, the area of each of the domains in plan view is not limited to a specific value. In plan view of the phononic crystal in the first three-dimensional structure 35a or the second three-dimensional structure 35b, each of the domains has, for example, an area that is more than or equal to 25 $P^2$. Each of the domains may have an area that is more than or equal to 25 P2 from the point of view of controlling the dispersion relation of phonons by the phononic crystal. For example, in a domain that has a square shape in plan view, a length of one side of the square shape is adjusted to be more than or equal to 5×P so that the domain has an area that is more than or equal to 25 $P^2$.

The beam 30 satisfies, for example, at least one of the following conditions (Ie) or (IIe). Consequently, for example, the physical properties of the p-type portion 30p or the n-type portion 30n in the thickness direction of the beam 30 are less likely to vary. The beam 30 may satisfy both of the conditions (Ie) and (IIe).

(Ie) The first recesses 32a form through holes in the first three-dimensional structure 35a.

(IIe) The second recesses 32b form through holes in the second three-dimensional structure 35b.

In the first three-dimensional structure 35a, an end portion of each of the first recesses 32a opposite to the opening thereof may be closed. In this case, the mechanical strength of the p-type portion 30p tends to be high. In the second three-dimensional structure 35b, an end portion of each of the second recesses 32b opposite to the opening thereof may be closed. In this case, the mechanical strength of the n-type portion 30n tends to be high.

In the first three-dimensional structure 35a, a depth of each of the first recesses 32a, that is, a dimension of each of the first recesses 32a in the thickness direction of the beam 30 is not limited to a specific value. The ratio of the depth of each of the first recesses 32a to the dimension d1 of the opening of the first recess 32a is, for example, more than or equal to 1 and less than or equal to 10. In the second three-dimensional structure 35b, the depth of each of the second recesses 32b, that is, a dimension of each of the second recesses 32b in the thickness direction of the beam 30 is not limited to a specific value. The ratio of the depth of each of the second recesses 32b to the dimension d2 of the opening of the second recess 32b is, for example, more than or equal to 1 and less than or equal to 10.

As illustrated in FIG. 1A and FIG. 1B, the beam 30 includes, for example, a connected portion 39a and a connected portion 39b. The connected portion 39a is formed at one end portion in the longitudinal direction of the beam 30, and the connected portion 39b is formed at the other end portion in the longitudinal direction of the beam 30. The beam 30 is connected at the connected portion 39a and the connected portion 39b to the base substrate 10. The connected portion 39a connects the p-type portion 30p to the base substrate 10. The connected portion 39b connects the n-type portion 30n to the base substrate 10.

The infrared light receiver 20 is, for example, joined to an upper surface of the beam 30. The position at which the infrared light receiver 20 is joined to the beam 30 is between two end portions in the longitudinal direction of the beam 30. The position is, for example, near the center in the longitudinal direction of the beam 30. The infrared light receiver 20 is supported in a state of being separated from the base substrate 10 by the separated portion 31 of the beam 30. The beam 30 is, for example, a double-supported beam.

The number of the beams 30 in the infrared sensor 1a may be one and may be more than or equal to two. For example, the beam 30 may include cantilevers that are connected to the infrared light receiver.

The infrared light receiver 20 is, for example, a thermopile infrared light receiver. As illustrated in FIG. 1B, the beam 30 has, for example, a first region 33a, a second region 33b, and a joint region 33c. The first region 33a has a first Seebeck coefficient. The second region 33b has a second Seebeck coefficient that differs from the first Seebeck coefficient. The joint region 33c is a region to which the first region 33a and the second region 33b are joined. In the infrared sensor 1a, the infrared light receiver 20 and the joint region 33c are joined to each other.

For example, the beam 30 is a single layer. One end portion of the first region 33a and one end portion of the second region 33b are joined to the joint region 33c and form a thermocouple element. The joint region 33c, for example, overlaps the infrared light receiver 20 in plan view. In plan view, the joint region 33c is located at, for example, the center of the infrared light receiver 20. A difference between the first Seebeck coefficient and the second Seebeck coefficient is not limited to a specific value. The difference is, for example, more than or equal to 10 μV/K. Note that the Seebeck coefficient in the present specification means a value at 25° C.

As illustrated in FIG. 1A and FIG. 1B, the base substrate 10 has a recess 12. In plan view, the area of the recess 12 is larger than the area of the infrared light receiver 20. In addition, in plan view, the infrared light receiver 20 is surrounded by the outer edge of the recess 12. In the thickness direction of the base substrate 10, the recess 12 is formed between the base substrate 10, and the infrared light receiver 20 and the beam 30. The infrared light receiver 20 and the beam 30 are, for example, suspended above the recess 12. The two end portions of the beam 30 in the longitudinal direction are, for example, connected to a side surface of the recess 12. Instead of forming the recess 12 on the base substrate 10, a support for suspending the infrared light receiver 20 and the beam 30 may be disposed.

As illustrated in FIG. 1A, the infrared sensor 1a further includes, for example, a first wire 40a, a second wire 40b, a first signal processing circuit 50a, and a second signal processing circuit 50b. The first wire 40a is electrically connected to the first region 33a. The second wire 40b is electrically connected to the second region 33b. The first signal processing circuit 50a is electrically connected to the first wire 40a. The second signal processing circuit 50b is electrically connected to the second wire 40b.

The first wire 40a, the second wire 40b, the first signal processing circuit 50a, and the second signal processing circuit 50b are disposed, for example, on the base substrate 10.

The first wire 40a is electrically connected to, for example, an end portion of the first region 33a in the longitudinal direction. This end portion is located at the connected portion 39a of the beam 30. The second wire 40b is electrically connected to, for example, an end portion of the second region 33b in the longitudinal direction. This end portion is located at the connected portion 39b of the beam 30. The first wire 40a electrically connects the first region 33a to the first signal processing circuit 50a. The second wire 40b electrically connects the second region 33b to the second signal processing circuit 50b. The first signal processing circuit 50a and the second signal processing circuit 50b are, for example, two circuits that are independent from each other. The two circuits of the first signal processing circuit 50a and the second signal processing circuit 50b may be one integrated circuit.

As illustrated in FIG. 1A and FIG. 1B, in the infrared sensor 1a, an electrical path connecting the infrared light receiver 20 and the first wire 40a and an electrical path connecting the infrared light receiver 20 and the second wire 40b are formed in the longitudinal direction of the beam 30. Therefore, in the infrared sensor 1a, macro heat transfer occurs in the longitudinal direction of the beam 30.

When infrared light is incident on the infrared light receiver 20, the temperature of the infrared light receiver 20 increases. At this time, the more the base substrate 10, which is a heat bath, and members on the base substrate 10 are highly thermally insulated from the infrared light receiver 20, the more the temperature of the infrared light receiver 20 increases largely. In the thermocouple element that is joined to the thermopile infrared light receiver 20, an electromotive force due to a Seebeck effect is generated with the temperature increase. A signal accompanying the electromotive force is processed by the first signal processing circuit 50a and the second signal processing circuit 50b, and infrared light is detected. Depending on the method of signal processing in the infrared sensor 1a, the infrared sensor 1a can measure the strength of infrared light and/or measure the temperature of an object.

The material that constitutes the first region 33a and the material that constitutes the second region 33b are each not limited to a specific material. The material that constitutes the first region 33a and the material that constitutes the second region 33b each may be a semiconductor or an insulator. The semiconductor may be a semiconductor of a single element, such as Si and Ge. The semiconductor may be a compound semiconductor, such as SiN, SiC, SiGe, GaAs, InAs, InSb, InP, GaN, and AN. The semiconductor may be an oxide semiconductor, such as $Fe_2O_3$, $VO_2$, $TiO_2$, and $SrTiO_3$. The semiconductors as the material that constitutes the first region 33a and the material that constitutes the second region 33b are, however, not limited to these examples. The material that constitutes the first region 33a and the material that constitutes the second region 33b have, for example, compositions that differ from each other. Meanwhile, when the material that constitutes the first region 33a and the material that constitutes the second region 33b are semiconductors, these materials may have the same basic composition. In this case, these materials have electrical conductivity types of different polarities. The electrical conductivity types of the semiconductors are adjustable by a publicly known method, such as doping. For example, the material that constitutes the first region 33a is a p-type semiconductor, and the material that constitutes the second region 33b is an n-type semiconductor. In this case, the first region 33a corresponds to the p-type portion 30p, and the second region 33b corresponds to the n-type portion 30n.

The material that constitutes the first region 33a and the material that constitutes the second region 33b each may be monocrystalline, may be polycrystalline, and may be amorphous.

The base substrate 10 is not limited to a specific substrate. The base substrate 10 is constituted by, for example, a semiconductor. The semiconductor is, for example, silicon. In this case, an oxide film may be formed on an upper surface 16 of the base substrate 10. The oxide film is, for example, a $SiO_2$ film.

The configuration of the infrared light receiver 20 is not limited to a specific configuration as long as the infrared sensor 1a can detect infrared light. The infrared light receiver 20 is constituted by, for example, a silicon-based semiconductor. The silicon-based semiconductor is, for example, Si or SiGe.

The material that constitutes the first wire 40a and the material that constitutes the second wire 40b are not limited to specific materials. These materials are each, for example, a semiconductor, a metal material, or a metal oxide. The semiconductor is doped with, for example, a predetermined dopant. The metal material is, for example, a material, such as Ti, having low thermal conductivity. The metal compound is a material, such as TiN, having low thermal conductivity.

The first signal processing circuit 50a and the second signal processing circuit 50b each can have a publicly known configuration capable of processing electric signals.

With reference to FIG. 4A to FIG. 4E, one example of a method of manufacturing the infrared sensor 1a in Embodiment 1 will be described below. The method of manufacturing the infrared sensor 1a is not limited to the following example.

Figure 4A:
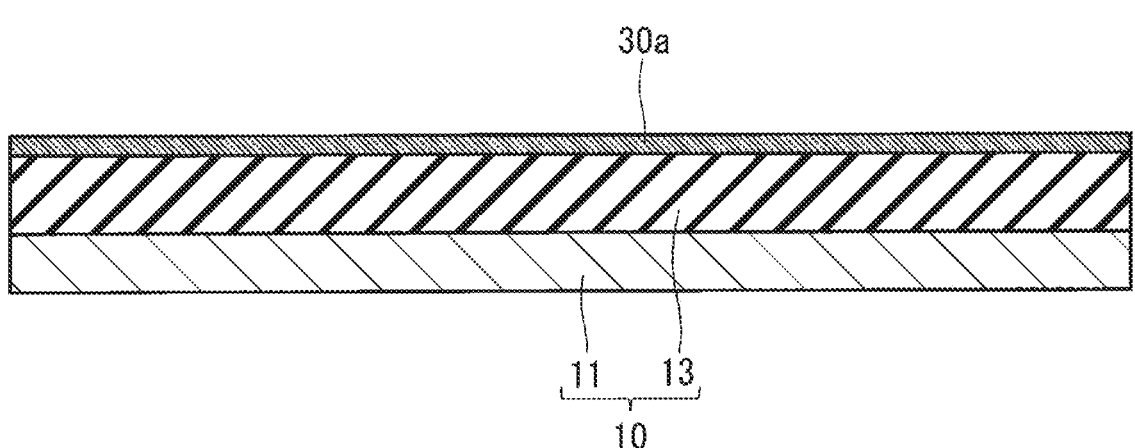
FIG. 4A is a sectional view illustrating one example of a method of manufacturing the infrared sensor according to Embodiment 1.

First, as illustrated in FIG. 4A, a silicon substrate 11 is prepared. Next, one main surface side of the silicon substrate 11 in the thickness direction thereof is thermally oxidized, thereby forming an insulating film 13 that contains $SiO_2$. The base substrate 10 is thus obtained. Next, a beam layer 30a is formed on an upper surface of the insulating film 13. The beam layer 30a can be formed by, for example, a publicly known thin-film formation method, such as a chemical vapor deposition method (CVD method). The material that constitutes the beam layer 30a is not limited to a specific material. The material that constitutes the beam layer 30a is, for example, a material that changes to the p-type portion 30p and the n-type portion 30n through doping. The thickness of the beam layer 30a is not limited to a specific value. The thickness of the beam layer 30a is, for example, more than or equal to 10 nm and less than or equal to 500 nm. As a member that includes the base substrate 10 and the beam layer 30a, a SOI wafer may be used.

Figure 4B:
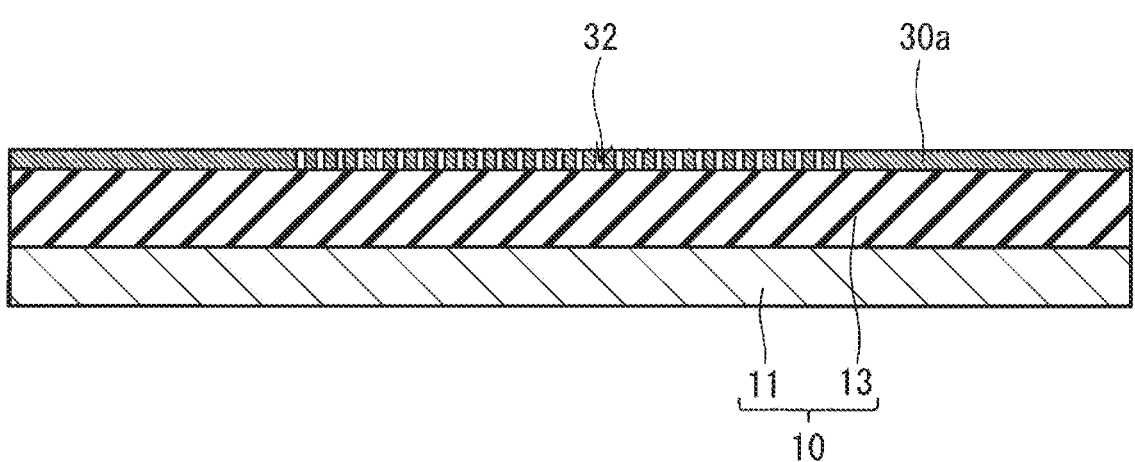
FIG. 4B is a sectional view illustrating one example of a method of manufacturing the infrared sensor according to Embodiment 1.

Next, as illustrated in FIG. 4B, recesses 32 that are regularly arranged in plan view are formed in the beam layer 30a. When the periodic interval in the arrangement of the recesses 32 is more than or equal to 100 nm and less than or equal to 300 nm, the recesses 32 may be formed by, for example, electron beam lithography. When the periodic interval in the arrangement of the recesses 32 is less than or equal to 1 nm and more than or equal to 100 nm, the recesses 32 may be formed by, for example, block-copolymer lithography. The block-copolymer lithography is a method that is advantageous for forming, for example, a phononic crystal in a polycrystalline state.

Figure 4C:
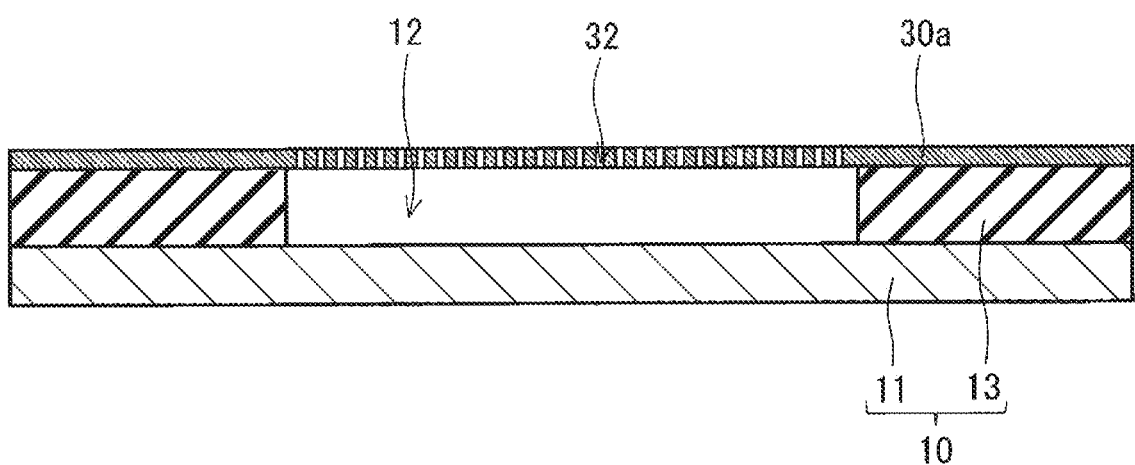
FIG. 4C is a sectional view illustrating one example of a method of manufacturing the infrared sensor according to Embodiment 1.

Next, as illustrated in FIG. 4C, photolithography and selective etching are performed on the beam layer 30a and the insulating film 13. Consequently, the shape of the beam 30 can be obtained, and the recess 12 is formed. As a result of the formation of the recess 12, a portion of the beam layer 30a that has changed to the shape of the beam 30 is separated from the base substrate 10.

Figure 4D:
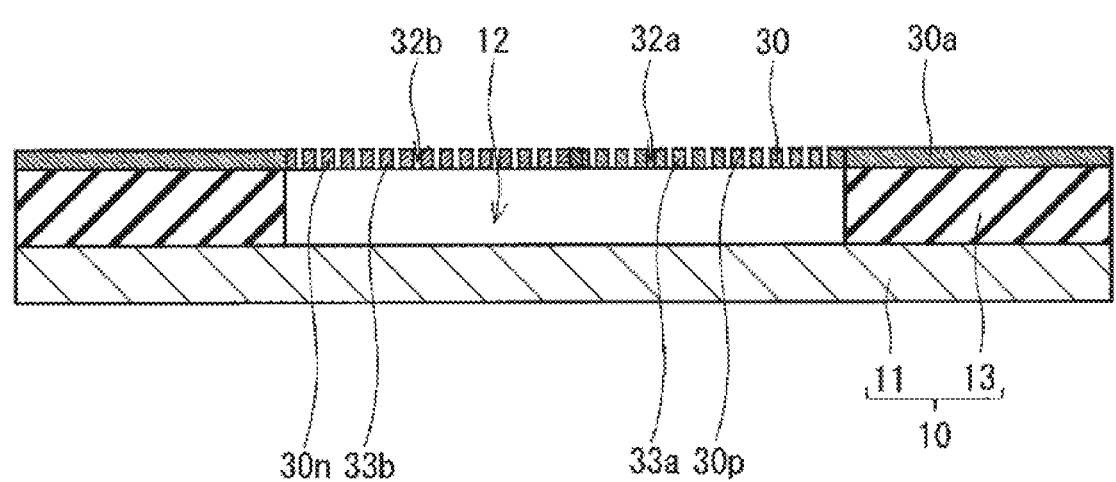
FIG. 4D is a sectional view illustrating one example of a method of manufacturing the infrared sensor according to Embodiment 1.

Next, as illustrated in FIG. 4D, doping is performed on the portion of the beam layer 30a that has changed to the shape of the beam 30 to form the first region 33a, the second region 33b, and the joint region 33c. For example, a portion that changes to the first region 33a is subjected to p-type doping, and a portion that changes to the second region 33b is subjected to n-type doping. Note that, for succeeding formation of the first wire 40a and the second wire 40b, doping may be performed on a portion of the beam layer 30a that overlaps the base substrate 10 in plan view.

Figure 4E:
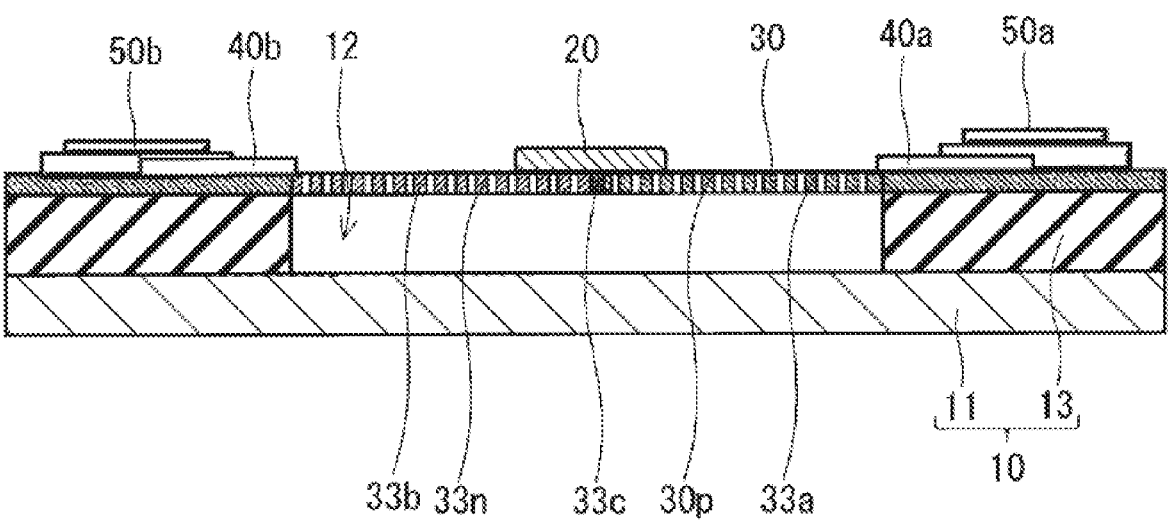
FIG. 4E is a sectional view illustrating one example of a method of manufacturing the infrared sensor according to Embodiment 1.

Next, as illustrated in FIG. 4E, the infrared light receiver 20 is formed on an upper surface of the beam 30 so as to be in contact with the joint region 33c. In addition, the first wire 40a and the second wire 40b that are electrically connected to the first region 33a and the second region 33b, respectively, are formed. The first wire 40a and the second wire 40b can be formed by, for example, photolithography and sputtering. Next, the first signal processing circuit 50a and the second signal processing circuit 50b are formed on the base substrate 10. Further, necessary electrical connection is ensured, and the infrared sensor 1a in Embodiment 1 is obtained. The infrared light receiver 20, the first signal processing circuit 50a, and the second signal processing circuit 50b can be formed by a publicly known method.

In principle, the infrared sensor 1a functions as an infrared sensor independently. Meanwhile, an array structure may be configured by arranging infrared sensors 1a on the silicon substrate 11 such that each of the infrared sensors 1a corresponds to one pixel. With such an array structure, for example, at least one processing that is selected from the group consisting of imaging of an object having a temperature that is less than or equal to an upper limit value, evaluation of infrared light radiation, or evaluation of strength distribution of a laser beam is possible.

The elastic moduli of the first portion 34p and the second portion 34q of the beam 30 can be determined by, for example, subjecting portions corresponding to the first portion 34p and the second portion 34q in the state illustrated in FIG. 4B to a nanoindentation test. In the state illustrated in FIG. 4B, the beam layer 30a has the recesses 32, and the entirety of the beam layer 30a is in contact with the base substrate 10. Note that, although the portions corresponding to the first portion 34p and the second portion 34q may be subjected to doping, the elastic moduli of the portions before the doping and the elastic moduli thereof after the doping are substantially the same. The elastic moduli of the first portion 34p and the second portion 34q may be determined by subjecting a sample, which is obtained by cutting a portion of the beam 30 illustrated in FIG. 4D or FIG. 4E, in a state of being fixed to a substrate such as a silicon substrate to a nanoindentation test.

Embodiment 2

Figure 5A:
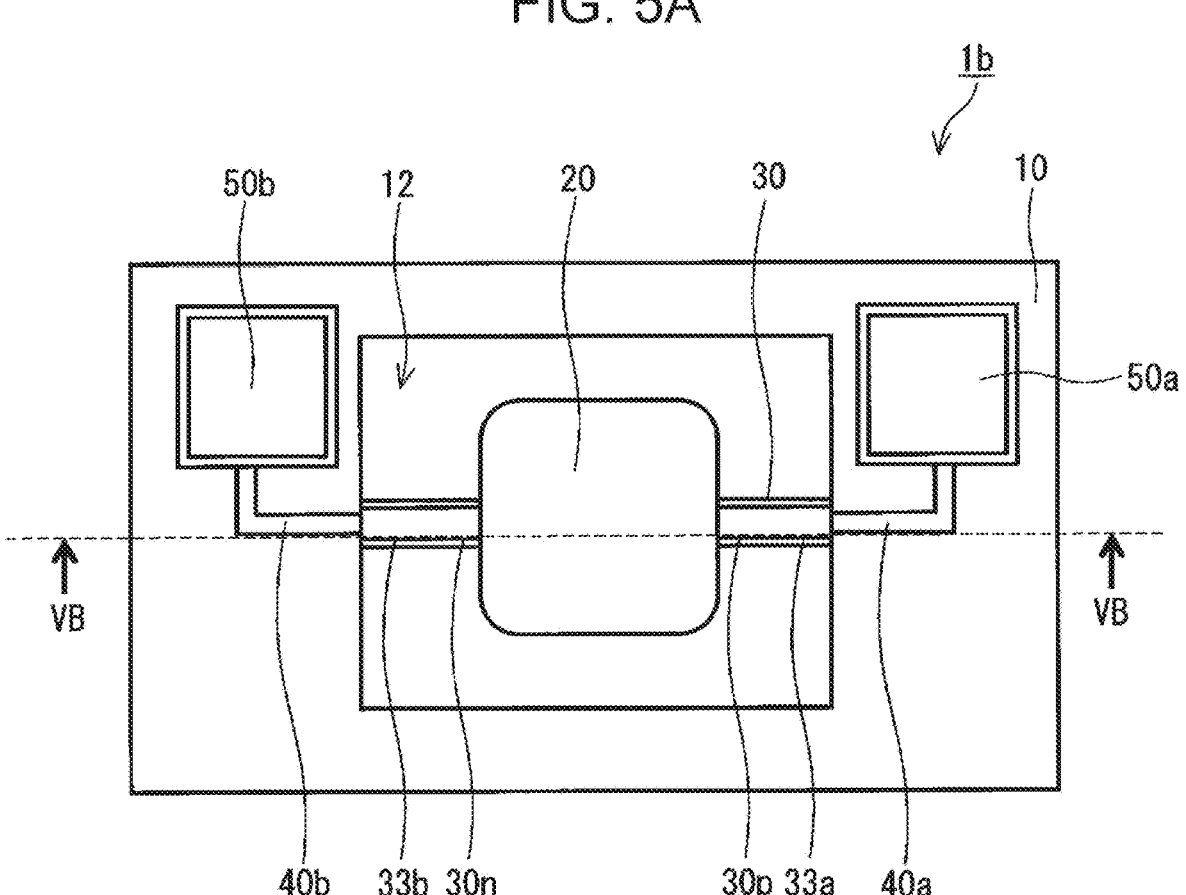
FIG. 5A is a plan view schematically illustrating an infrared sensor according to Embodiment 2.
Figure 5B:
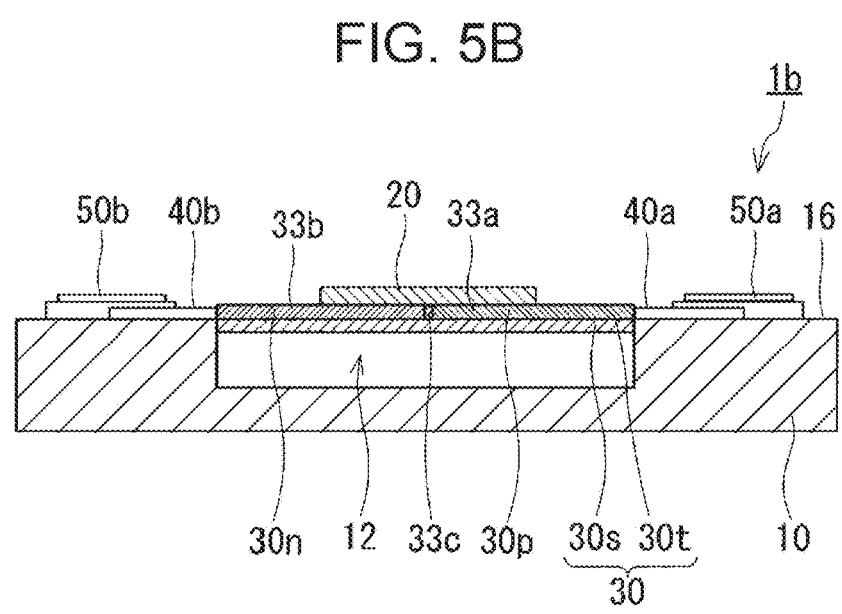
FIG. 5B is a sectional view of the infrared sensor in FIG. 5A taken along line VB-VB.

FIG. 5A and FIG. 5B illustrate an infrared sensor 1b in Embodiment 2. The infrared sensor 1b is configured similarly to the infrared sensor 1a except for portions that will be particularly described. Components of the infrared sensor 1b identical or corresponding to the components of the infrared sensor 1a are given identical reference signs and will not be described in detail. Description relating to the infrared sensor 1a also applies to the infrared sensor 1b as long as there is no technical contradiction.

In the infrared sensor 1b, the infrared light receiver 20 is, for example, a thermopile infrared light receiver. As illustrated in FIG. 5B, the beam 30 in the infrared sensor 1b includes a base layer 30s and a thermocouple layer 30t. The thermocouple layer 30t is disposed on the base layer 30s. In other words, the beam 30 has a layered structure including the base layer 30s and the thermocouple layer 30t. The thermocouple layer 30t has the first region 33a, the second region 33b, and the joint region 33c. In the infrared sensor 1b, the material that constitutes the base layer 30s is, for example, amorphous Si. The thermal conductivity of amorphous Si is low. Therefore, the infrared sensor 1b is advantageous from the point of view of further improving sensitivity to infrared light.

The other configurations of the infrared sensor 1b, including preferable embodiments, are the same as corresponding configurations of the infrared sensor 1a. The principle of operation of the infrared sensor 1b is the same as the principle of the operation of the infrared sensor 1a.

The infrared sensor 1b can be manufactured by, for example, applying the method of manufacturing the infrared sensor 1a.

Embodiment 3

Figure 6A:
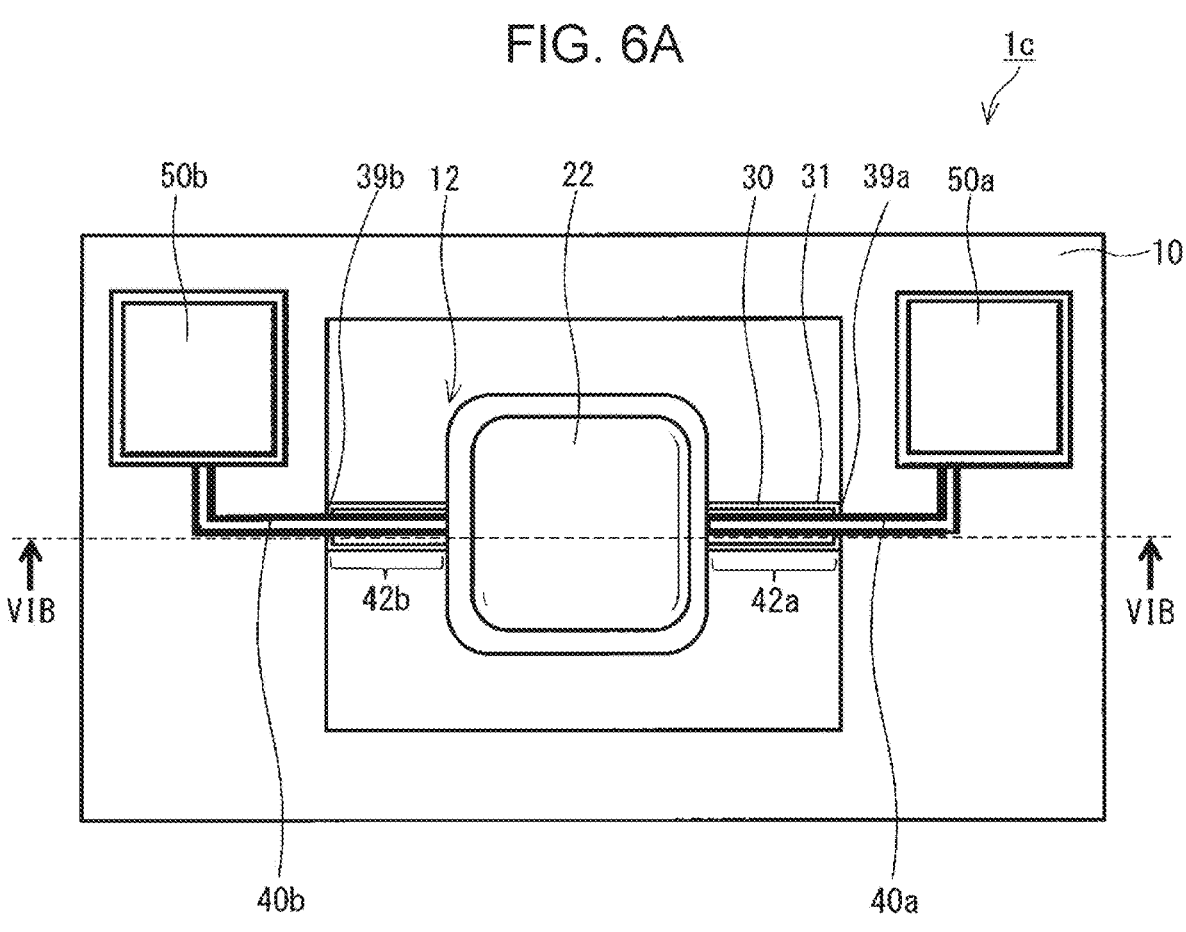
FIG. 6A is a plan view schematically illustrating an infrared sensor according to Embodiment 3.
Figure 6B:
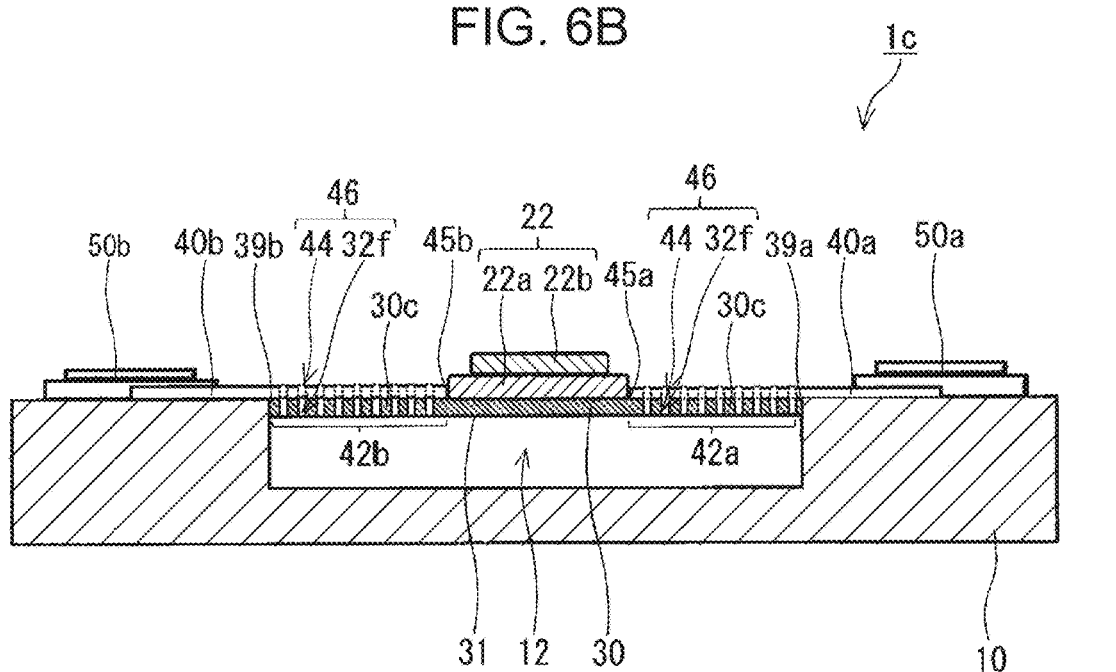
FIG. 6B is a sectional view of the infrared sensor in FIG. 6A taken along line VIB-VIB.

FIG. 6A and FIG. 6B illustrate an infrared sensor 1c in Embodiment 3. The infrared sensor 1c is configured similarly to the infrared sensor 1a except for portions that will be particularly described. Components of the infrared sensor 1c identical or corresponding to the components of the infrared sensor 1a are given identical reference signs and will not be described in detail. Description relating to the infrared sensor 1a also applies to the infrared sensor 1c as long as there is no technical contradiction.

Figure 7:
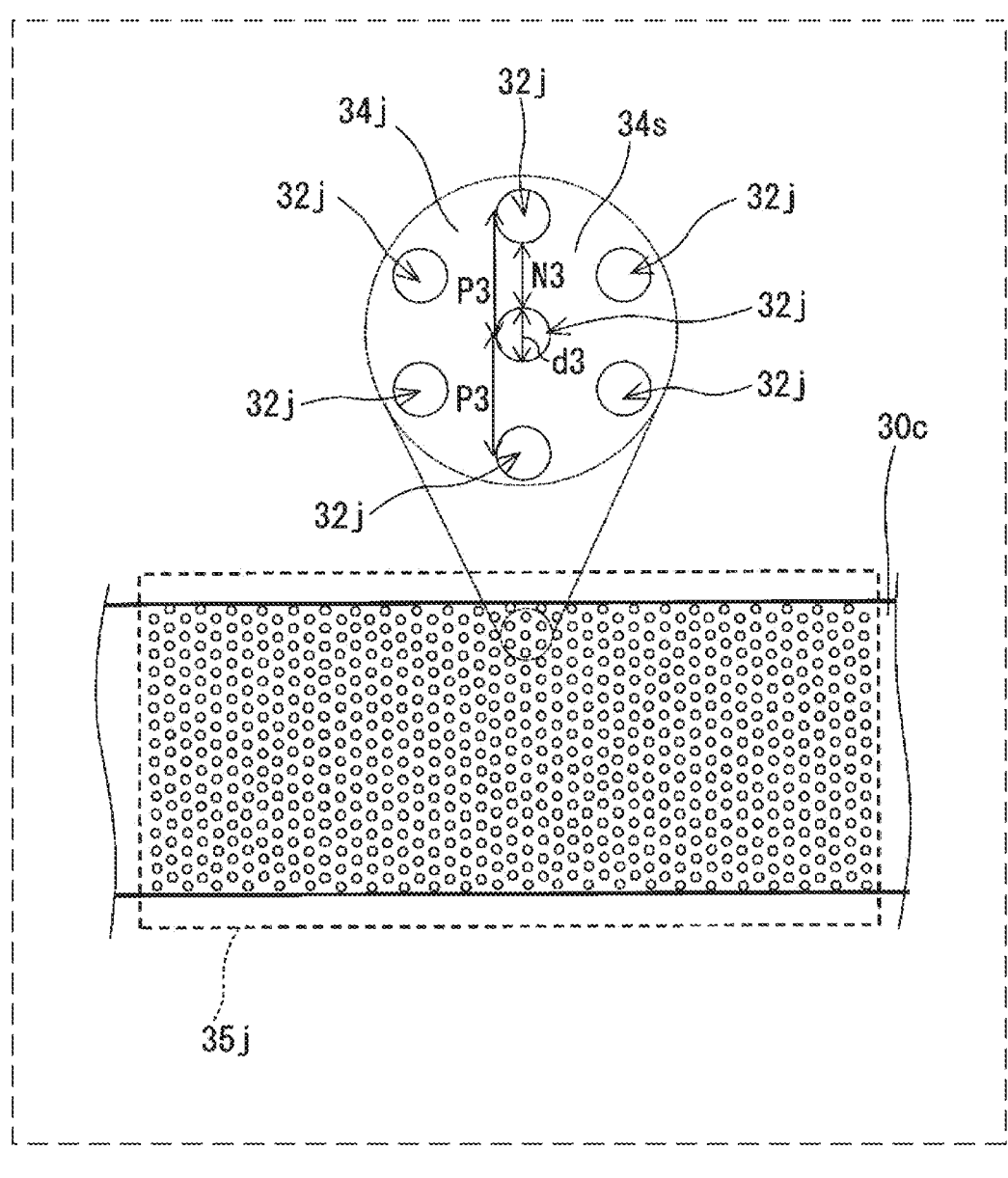
FIG. 7 is a plan view illustrating a portion of the infrared sensor in FIG. 6A.

As illustrated in FIG. 6A and FIG. 6B, the infrared sensor 1c includes the base substrate 10, an infrared light receiver 22, and the beam 30. The beam 30 includes the separated portion 31 that is separated from the base substrate 10 so as to be suspended above the base substrate 10. The beam 30 is connected at the separated portion 31 to the infrared light receiver 22. The beam 30 includes an electrical conductor 30c. FIG. 7 is a plan view illustrating a portion of the electrical conductor 30c. As illustrated in FIG. 7, the electrical conductor 30c has a three-dimensional structure 35j. The three-dimensional structure 35j includes recesses 32j and a solid portion 34j formed between the recesses 32j. A smallest dimension N3 of the solid portion 34j in plan view between the recesses 32j adjacent to each other in plan view is less than or equal to 100 nm. For example, in plan view, a shortest distance between a specific one of the recesses 32j and another one of the recesses 32j located closest to the specific recess 32j corresponds to the smallest dimension N3.

Due to the smallest dimension N3 of the solid portion 34j in plan view being less than or equal to 100 nm, the electrical conductor 30c tends to have high heat-insulating properties. This is because the elastic modulus of a predetermined portion of the solid portion 34j tends to be low, and the thermal conductivity of the electrical conductor 30c also tends to be low. Therefore, the electrical conductor 30c tends to have high heat-insulating properties. As a result, the sensitivity of the infrared sensor 1c tends to be high.

In the infrared sensor 1c, the solid portion 34j, for example, includes a portion 34s that has an elastic modulus Es of less than or equal to 80% of an elastic modulus Er of a reference sample that is made of a material of a type identical to the type of a material constituting the solid portion 34j and that does not have recesses. Consequently, the thermal conductivity of the electrical conductor 30c tends to be low more reliably, and the heat-insulating properties of the electrical conductor 30c tend to be high.

The elastic modulus Er and the elastic modulus Es are determined by, for example, a nanoindentation method. As test conditions for the nanoindentation method, for example, the conditions described in examples can be employed. The reference sample is formed, for example, in the same manner as the electrical conductor 30c except that the reference sample does not have recesses. The second reference sample is formed, for example, in the same manner as the n-type portion 30n except that the second reference sample does not have recesses.

The elastic modulus Es of the portion 34s may be less than or equal to 75%, less than or equal to 70%, less than or equal to 65%, less than or equal to 60%, less than or equal to 50%, or less than or equal to 40% of the elastic modulus Er. The elastic modulus Es of the portion 34s is, for example, more than or equal to 10% of the elastic modulus Er and may be more than or equal to 15%, more than or equal to 20%, more than or equal to 25%, or more than or equal to 30% of the elastic modulus Er.

Substances contained in the portion 34s are not limited to substances of specific types. The solid portion 34j may be formed with a monocrystal, may be formed with a polycrystal, and may be formed with an amorphous substance. The portion 34s of the solid portion 34j, for example, contains silicon and has an elastic modulus of less than or equal to 100 GPa.

In the infrared sensor 1c, the solid portion 34j has different elastic moduli at locations around a specific one of the recesses 32j in plan view of the three-dimensional structure 35j. The elastic moduli include a value whose difference from a largest value of the elastic moduli is more than or equal to 10% of the largest value. In this case, the elastic moduli at locations around the recess 32j tend to vary greatly. Such variations in the elastic moduli can effectively contribute to a reduction in the thermal conductivity of the electrical conductor 30c. The electrical conductor 30c thus tends to have high heat insulation performance more reliably.

The three-dimensional structure 35j is, for example, a phononic crystal. As illustrated in FIG. 7, the recesses 32j in the three-dimensional structure 35j are, for example, arranged regularly in an in-plane direction.

As illustrated in FIG. 7, in plan view of the three-dimensional structure 35j, the recesses 32j are arranged at a predetermined periodic interval P3. The periodic interval P3 is, for example, less than or equal to 300 nm. Consequently, the electrical conductor 30c tends to have high heat insulation performance more reliably.

The periodic interval P3 may be less than or equal to 280 nm, may be less than or equal to 260 nm, may be less than or equal to 250 nm, and may be less than or equal to 200 nm. The periodic interval P3 is, for example, more than or equal to 1 nm, and may be more than or equal to 5 nm and may be more than or equal to 10 nm.

The shapes of the recesses 32j in plan view of the three-dimensional structure 35j are not limited to specific shapes. As illustrated in FIG. 7, the recesses 32j are circular in plan view of the three-dimensional structure 35j.

The recesses 32j may be rectangular in plan view of the three-dimensional structure 35j. In this case, when the electrical conductor 30c is rectangular in plan view, the recesses 32j are easily disposed in a wide area.

The recesses 32j are, for example, arranged at the periodic interval P3 in a specific direction. In plan view of the three-dimensional structure 35j, an opening of each of the recesses 32j in a direction parallel to the specific direction has a predetermined dimension d3. The dimension d3 and the periodic interval P3, for example, satisfy the relationship of d3/P3≥0.5. The dimension d3 is, for example, more than or equal to 0.5 nm and less than or equal to 295 nm.

As illustrated in FIG. 7, for example, in plan view of the three-dimensional structure 35j, the regularly arranged recesses 32j form a unit lattice. This unit lattice is not limited to a specific lattice. In plan view of the three-dimensional structure 35j, the unit lattice that is formed by the regularly arranged recesses 32j is, for example, a hexagonal lattice. In plan view of the three-dimensional structure 35j, the unit lattice that is formed by the rectangular arranged recesses 32j may be a square lattice, may be a rectangular lattice, and may be a face-centered rectangular lattice.

As illustrated in FIG. 7, the phononic crystal in the three-dimensional structure 35j is, for example, a monocrystal. The phononic crystal in the three-dimensional structure 35j may be, for example, a polycrystal. In this case, in plan view of the three-dimensional structure 35j, the phononic crystal has domains, and a phononic crystal in each of the domains is a monocrystal. In the domains, the recesses 32j are arranged regularly in different directions. The orientations of the unit lattice in the domains are the same. The shapes of the domains may be the same or different in plan view of the three-dimensional structure 35j. The sizes of the domains may be the same or different in plan view of the three-dimensional structure 35j.

When the phononic crystal in the three-dimensional structure 35j is a polycrystal, the shapes of the domains in plan view are not limited to specific shapes. The shapes of the domains in plan view are, for example, polygonal shapes including a triangular shape, a square shape, and a rectangular shape, circular shapes, elliptic shapes, and composite shapes of these shapes. The shapes of the domains in plan view may be irregular shapes. The number of the domains included in the phononic crystal in the three-dimensional structure 35j is not limited to a specific value.

When the phononic crystal in the three-dimensional structure 35j is a polycrystal, the area of each of the domains in plan view is not limited to a specific value. In plan view of the three-dimensional structure 35j, each of the domains has an area of, for example, more than or equal to 25 $P^2$. Each of the domains may have an area that is more than or equal to 25 $P^2$ from the point of view of controlling the dispersion relation of phonons by the phononic crystal. For example, in a domain that has a square shape in plan view, a length of one side of the square shape is adjusted to be more than or equal to 5×P so that the domain has an area that is more than or equal to 25 $P^2$.

The recesses 32j, for example, form through holes in the three-dimensional structure 35j. Consequently, for example, the physical properties of the electrical conductor 30c in the thickness direction of the beam 30 are less likely to vary.

In the three-dimensional structure 35j, an end portion of each of the recesses 32j opposite to the opening thereof may be closed. In this case, the mechanical strength of the electrical conductor 30c tends to be high.

In the three-dimensional structure 35j, the depth of each of the recesses 32j, that is, a dimension of each of the recesses 32j in the thickness direction of the beam 30 is not limited to a specific value. The ratio of the depth of each of the recesses 32j to the dimension d3 of the opening of the recess 32j is, for example, more than or equal to 1 and less than or equal to 10.

As illustrated in FIG. 1A and FIG. 1B, the beam 30 includes, for example, the connected portion 39a and the connected portion 39b. The connected portion 39a is formed at one end portion in the longitudinal direction of the beam 30, and the connected portion 39b is formed at the other end portion in the longitudinal direction of the beam 30. The beam 30 is connected at the connected portion 39a and the connected portion 39b to the base substrate 10.

The infrared light receiver 22 is, for example, joined to an upper surface of the beam 30. The position at which the infrared light receiver 22 is joined to the beam 30 is between two end portions in the longitudinal direction of the beam 30. The position is, for example, near the center in the longitudinal direction of the beam 30. The infrared light receiver 22 is supported in a state of being separated from the base substrate 10 by the separated portion 31 of the beam 30. The beam 30 is, for example, a double-supported beam.

As illustrated in FIG. 6A and FIG. 6B, the base substrate 10 has the recess 12. In plan view, the area of the recess 12 is larger than the area of the infrared light receiver 22. In addition, in plan view, the infrared light receiver 22 is surrounded by the outer edge of the recess 12. In the thickness direction of the base substrate 10, the recess 12 is formed between the base substrate 10, and the infrared light receiver 22 and the beam 30. For example, the infrared light receiver 22 and the beam 30 are suspended above the recess 12. The two end portions in the longitudinal direction of the beam 30 is, for example, connected to a side surface of the recess 12.

In the infrared sensor 1c, the infrared light receiver 22 is, for example, a bolometer infrared light receiver. The infrared sensor 1c, for example, further includes the first wire 40a, the second wire 40b, the first signal processing circuit 50a, and the second signal processing circuit 50b. The first wire 40a and the second wire 40b are each electrically connected to the infrared light receiver 22. The first signal processing circuit 50a is electrically connected to the first wire 40a. The second signal processing circuit 50b is electrically connected to the second wire 40b.

When infrared light is incident on the infrared light receiver 22, the temperature of the infrared light receiver 22 increases. At this time, the more the base substrate 10, which is a heat bath, and members on the base substrate 10 are highly thermally insulated from the infrared light receiver 22, the more the temperature of the infrared light receiver 22 increases largely. In the bolometer infrared light receiver 22, a change in electric resistance is generated with the temperature increase. A signal that indicates the generated change in the electric resistance is processed by the first signal processing circuit 50a and the second signal processing circuit 50b, and infrared light is detected. Depending on the method of signal processing in the infrared sensor 1c, the infrared sensor 1c can measure the strength of infrared light and/or measure the temperature of an object.

The first wire 40a, for example, has a first section 42a between a connected portion 45a at which the first wire 40a is connected to the infrared light receiver 22 and the first signal processing circuit 50a. The first section 42a is separated from the base substrate 10. The second wire 40b, for example, has a second section 42b between a connected portion 45b at which the second wire 40b is connected to the infrared light receiver 22 and the second signal processing circuit 50b. The second section 42b is separated from the base substrate 10. The beam 30, for example, has the three-dimensional structure 35j at the first section 42a and the second section 42b.

As illustrated in FIG. 6B, the first section 42a of the first wire 40a and the second section 42b of the second wire 40b are, for example, in contact with a surface of the beam 30. The first section 42a of the first wire 40a and the second section 42b of the second wire 40b each may be a portion of the beam 30. For example, portions of the beam 30 are formed with a doped semiconductor to obtain the first section 42a of the first wire 40a and the second section 42b of the second wire 40b.

As illustrated in FIG. 6B, the recesses 32j, for example, form first through holes 32f in the three-dimensional structure 35j. At least one of the first section 42a or the second section 42b, for example, has a phononic crystal structure having second through holes 44. Consequently, heat conduction in the first wire 40a and the second wire 40b can be suppressed, and the infrared sensor 1c tends to have high sensitivity more reliably.

In the infrared sensor 1c, the first through holes 32f and the second through holes 44 form, for example, continuous through holes 46 that extend along an identical straight line. With such a configuration, the infrared sensor 1c tends to have high sensitivity more reliably. In addition, it is also possible to form the three-dimensional structure 35j of the electrical conductor 30c of the beam 30 and the phononic crystal structure in the first section 42a and the second section 42b at the same time, which is excellent in manufacturability.

The infrared light receiver 22, for example, includes a resistance change layer 22a and an infrared-light absorbing layer 22b. The infrared-light absorbing layer 22b is disposed on the resistance change layer 22a. In other words, the infrared light receiver 22 has a layered structure including the resistance change layer 22a and the infrared-light absorbing layer 22b. The infrared-light absorbing layer 22b is, for example, located at the outermost layer of the infrared light receiver 22.

The material that constitutes the resistance change layer 22a is not limited to a specific material. The resistance change layer 22a, for example, includes a material in which a change in electric resistance due to temperature is large. Examples of the material included in the resistance change layer 22a are Pt, amorphous Si, and vanadium oxide. The temperature coefficient of resistance of these materials are large.

The material that constitutes the infrared-light absorbing layer 22b is not limited to a specific material. Examples of the material included in the infrared-light absorbing layer 22b are metals such as Ti, Cr, Au, Al, and Cu, oxides such as $SiO_2$, and nitrides such as TiN and SiN. When the infrared-light absorbing layer 22b has electrical conductivity, the infrared light receiver 22 may have an electrically insulating layer between the resistance change layer 22a and the infrared-light absorbing layer 22b.

The other configurations of the infrared sensor 1c, including preferable embodiments, are the same as corresponding configurations of the infrared sensor 1a.

The infrared sensor 1c can be manufactured by, for example, publicly known methods including a thin-film forming method, such as sputtering and vapor deposition, and a micromachining method, such as photolithography and selective etching. The infrared sensor 1c also can be manufactured by applying the above-described method of manufacturing the infrared sensor 1a.

Embodiment 4

Figure 8A:
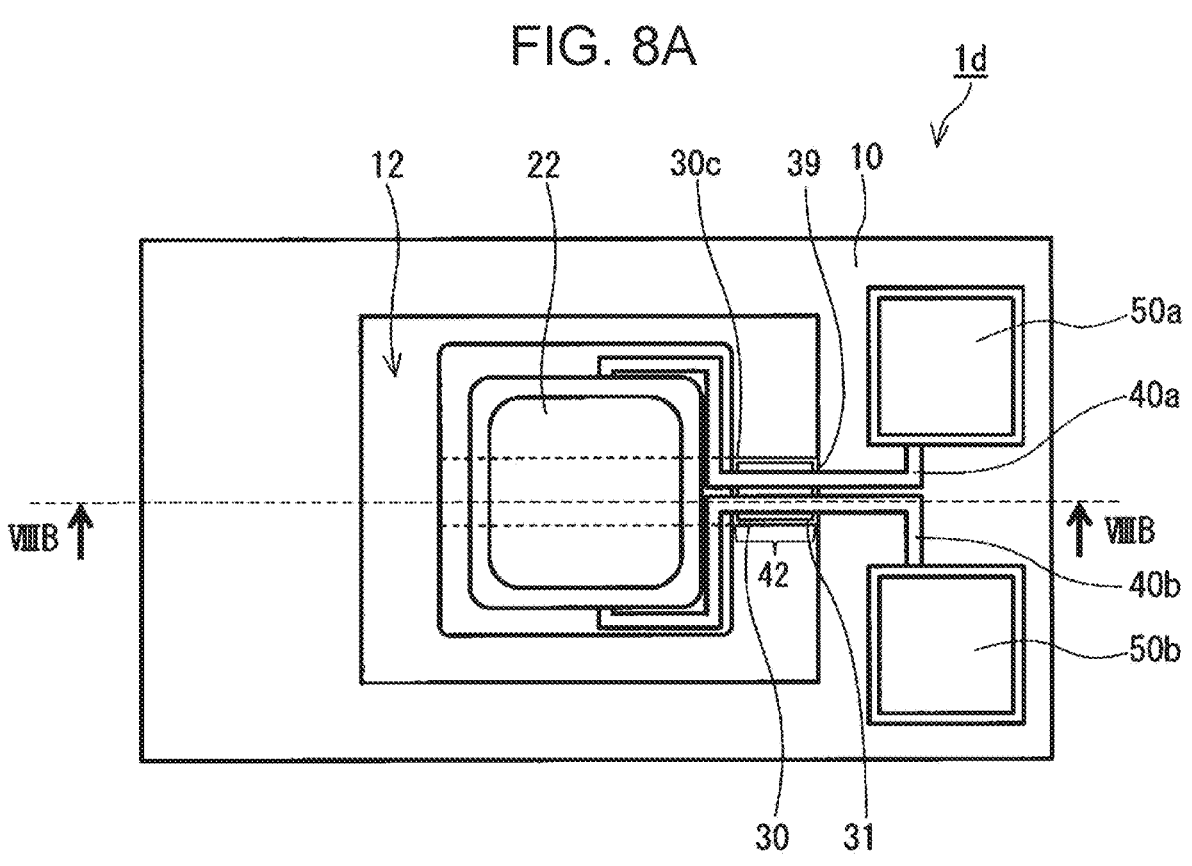
FIG. 8A is a plan view schematically illustrating an infrared sensor according to Embodiment 4.
Figure 8B:
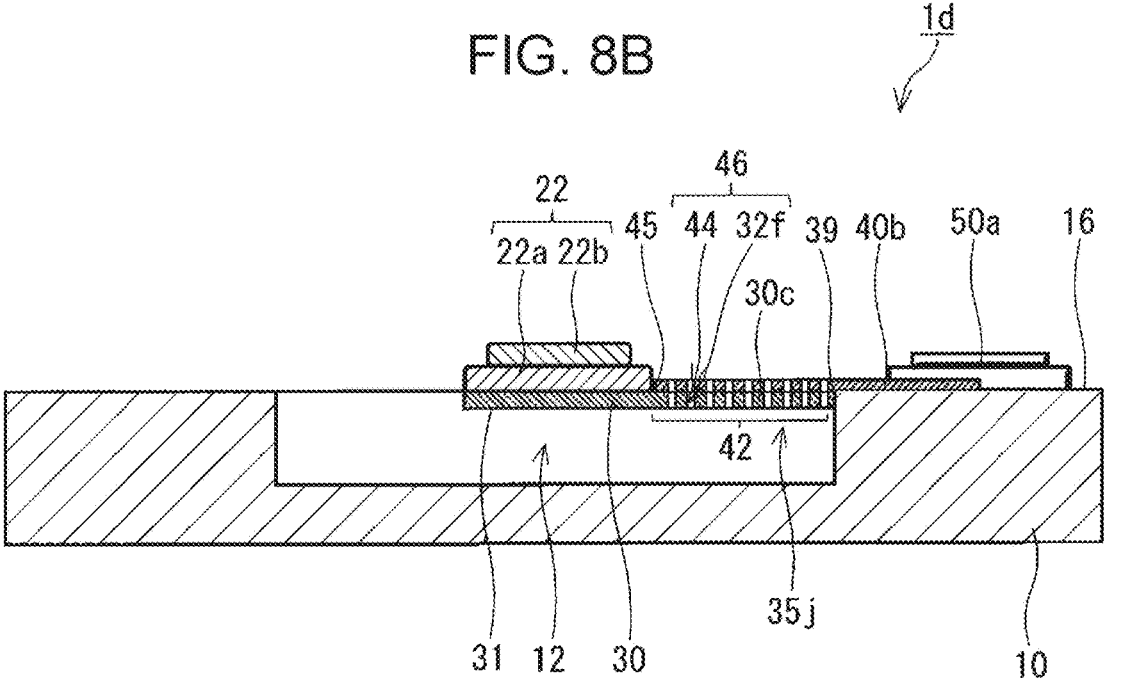
FIG. 8B is a sectional view of the infrared sensor in FIG. 8A taken along line VIIIB-VIIIB.

FIG. 8A and FIG. 8B illustrate an infrared sensor 1d in Embodiment 3. The infrared sensor 1d is configured similarly to the infrared sensor 1c except for portions that will be particularly described. Components of the infrared sensor 1d identical or corresponding to the components of the infrared sensor 1c are given identical reference signs and will not be described in detail. Description relating to the infrared sensor 1c also applies to the infrared sensor 1d as long as there is no technical contradiction.

In the infrared sensor 1d, the infrared light receiver 22 is, for example, a bolometer infrared light receiver. The beam 30 includes a connected portion 39 that is connected to the base substrate 10, and the separated portion 31 that is separated from the base substrate 10. The beam 30 includes the connected portion 39 at one end portion. At the separated portion 31, the beam 30 and the infrared light receiver 22 are joined to each other. For example, the infrared light receiver 22 and the beam 30 are connected to each other at another end portion of the beam 30 located at the separated portion 31. The infrared light receiver 22 is supported in a state of being separated from the base substrate 10 by the beam 30 that includes the separated portion 31. The beam 30 is a cantilever.

The base substrate 10 has the recess 12 at the upper surface 16 at which the infrared light receiver 22 is disposed. The recess 12 is formed between the base substrate 10, and the infrared light receiver 22 and the beam 30 in the thickness direction of the base substrate 10. The infrared light receiver 22 and the beam 30 are suspended above the recess 12 of the base substrate 10.

The first wire 40a and the second wire 40b each have a section 42 that is disposed between a connected portion 45 at which the first wire 40a and the second wire 40b are connected to the infrared light receiver 22, and the first signal processing circuit 50a and the second signal processing circuit 50b, and that is separated from the base substrate 10. In this section, the beam 30, for example, has the three-dimensional structure 35j.

The other configurations of the infrared sensor 1d, including preferable embodiments, are the same as corresponding configurations of the infrared sensor 1c. The principle of operation of the infrared sensor 1d is the same as the principle of the operation of the infrared sensor 1c.

The infrared sensor 1d can be manufactured by, for example, publicly known methods including a thin-film forming method, such as sputtering and vapor deposition, and a micromachining method, such as photolithography and selective etching. The infrared sensor 1d also can be manufactured by applying the above-described method of manufacturing the infrared sensor 1a.

Examples

Hereinafter, the present embodiments will be more specifically described with reference to examples. The infrared sensors in the present embodiments are, however, not limited to forms shown in the following examples.
Formation of Elastic-Modulus Measurement Samples A substrate that includes a silicon substrate, an insulating film, and a beam layer was prepared. This substrate was formed by Separation by Implanted Oxygen (SIMOX). One main surface side of the silicon substrate was thermally oxidized to form the insulating film. The insulating film contained $SiO_2$. The beam layer was a thin film of a monocrystalline silicon. The thickness of the beam layer was 100 nm. Next, through holes that were arranged regularly in an in-plane direction of the beam layer were formed by electron beam lithography or block-copolymer lithography. Elastic-modulus measurement samples 1-A, 2-A, 3-A, 4-A, 5-A, 6-A, and 7-A were thus obtained. In each of the samples, the beam layer was in a state of being in close contact with the insulating film, as illustrated in FIG. 4B. A periodic interval P of the arrangement of the through holes, a smallest dimension N of a solid portion of the beam layer in plan view between the through holes adjacent to each other in plan view of the beam layer, and a dimension d of an opening of each of the through holes in the arrangement direction of the through holes in these samples are indicated in Table 1. In addition, an elastic-modulus measurement reference sample that has a beam layer constituted by a flat monocrystalline silicon was formed in the same manner as the aforementioned samples except that through holes were not formed.

TABLE 1

| Sample | Periodic Interval P [nm] | Smallest Dimension N of Solid Portion [nm] | Dimension d of Opening of Through Hole [nm] |
|---|---|---|---|
| 1-A/1-B | 200 | 40 | 160 |
| 2-A/2-B | 300 | 60 | 240 |
| 3-A/3-B | 500 | 100 | 400 |
| 4-A/4-B | 750 | 150 | 600 |
| 5-A/5-B | 1000 | 200 | 800 |
| 6-A/6-B | 1500 | 300 | 1200 |
| 7-A/7-B | 2000 | 400 | 1600 |

Measurement of Elastic Modulus

Figure 9:
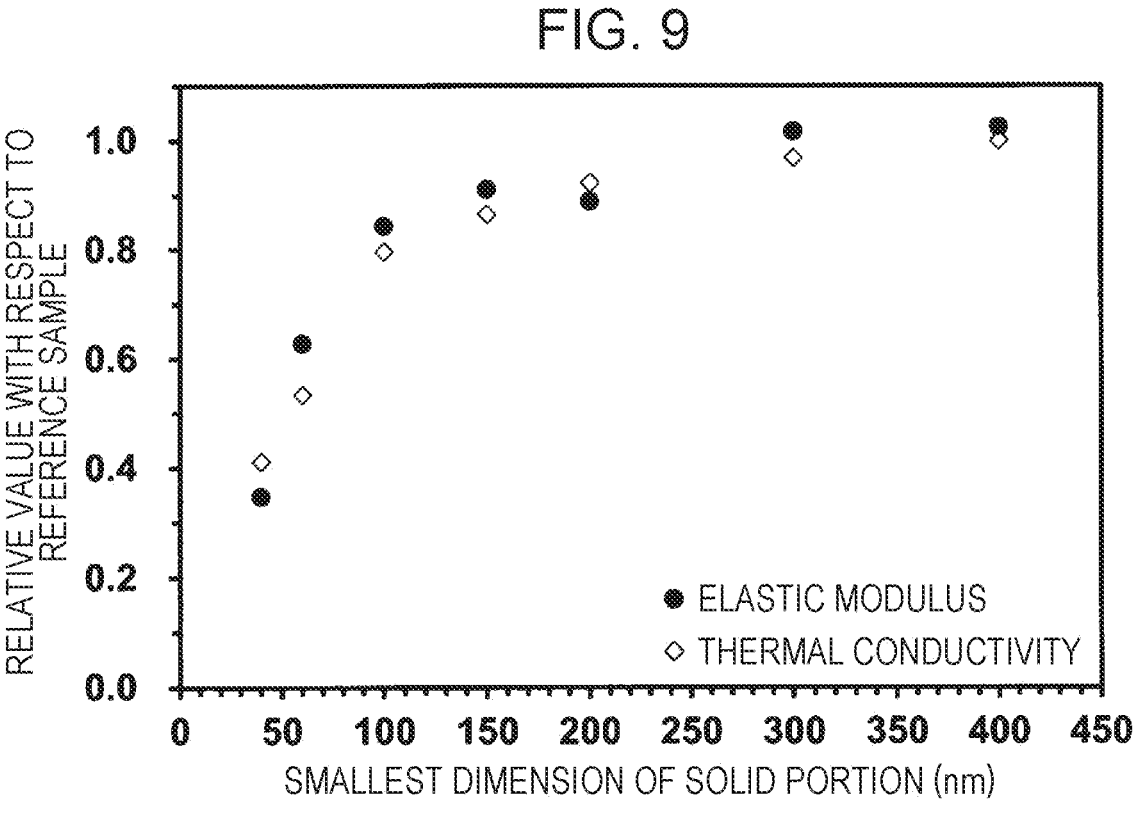
FIG. 9 is a graph showing a relationship between the smallest dimension of a solid portion of a sample, and the elastic modulus of the solid portion of the sample and the thermal conductivity of the sample.
Figure 10:
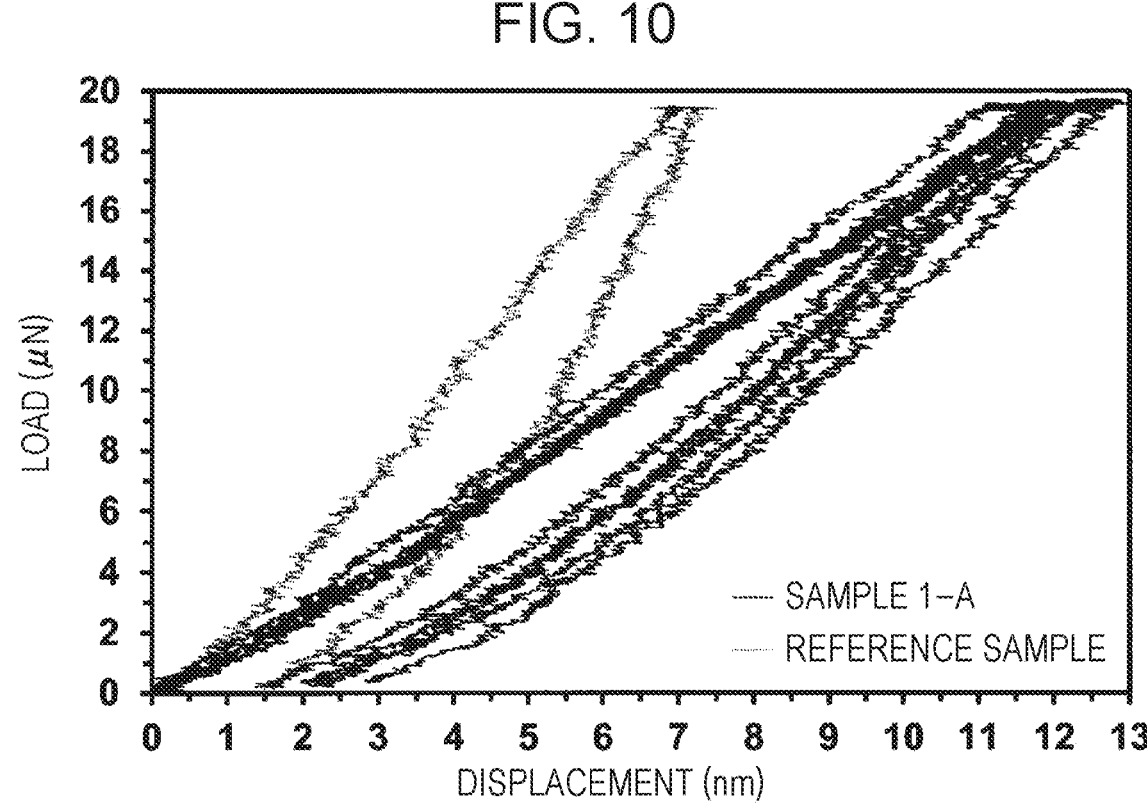
FIG. 10 shows load-displacement curves obtained through nanoindentation tests on Sample 1-A and a reference sample.

A nanoindentation test was performed at a specific location at a surface of the beam layer of each of the aforementioned elastic-modulus measurement samples 1-A, 2-A, 3-A, 4-A, 5-A, 6-A, 7-A, and the elastic-modulus measurement reference sample. On the basis of results of this test, an elastic modulus at the specific location at the surface of the beam layer of each of the samples was determined. In the nanoindentation test, a diamond indenter was used. A tip portion of the diamond indenter was machined to have a radius of curvature of 40 nm. In the nanoindentation test, the diamond indenter was pressed into the surface of the beam layer such that it took five seconds for the load of the diamond indenter to reach a largest value of 20 µN in a load control mode. Thereafter, the load was kept at the largest value of 20 µN for five seconds, and the load was released such that it took five seconds for the load to decrease to 0 µN. The environmental temperature in the nanoindentation test was adjusted to 27° C. Results of elastic-modulus measurement of the samples are indicated in FIG. 9. In FIG. 9, the elastic modulus at a specific location at the surface of the beam layer of each of the samples is indicated as a relative value with respect to the elastic modulus of the monocrystalline silicon that constitutes the beam layer of the elastic-modulus measurement reference sample. FIG. 10 indicates load-displacement curves that were obtained through the nanoindentation tests on the elastic-modulus measurement sample 1-A and the elastic-modulus measurement reference sample. In FIG. 10, load-displacement curves that were obtained through the nanoindentation tests performed at five locations in the elastic-modulus measurement sample 1-A are indicated. In addition, in FIG. 10, load-displacement curves that were obtained through the nanoindentation test performed at one location in the elastic-modulus measurement reference sample are indicated.

Formation of Thermal-Conductivity Measurement Samples

Selective etching was performed on the elastic-modulus measurement samples 1-A, 2-A, 3-A, 4-A, 5-A, 6-A, and 7-A to form thermal-conductivity measurement samples 1-B, 2-B, 3-B, 4-B, 5-B, 6-B, and 7-B, respectively. A beam was formed from the beam layer by selective etching, and a portion of the insulating film was removed to form a recess. In these samples, the beam was suspended at the silicon substrate as illustrated in FIG. 4C. In addition, selective etching was also similarly performed on the elastic-modulus measurement reference sample to form a beam and a recess, thereby forming a thermal-conductivity measurement reference sample.

Measurement of Thermal Conductivity

According to the time-domain thermoreflectance (TDTR) method, the thermal conductivity in the longitudinal direction of the beam in each of the thermal-conductivity measurement samples 1-B, 2-B, 3-B, 4-B, 5-B, 6-B, and 7-B was measured. This measurement was performed under conditions of an environmental temperature of 27° C. and a pressure of 0.5 Pa. The thermal conductivity in the longitudinal direction of the beam in the thermal-conductivity measurement reference sample was similarly measured. Results of the measurement of the thermal conductivity of each of the samples are indicated in FIG. 9. In FIG. 9, the thermal conductivity in the longitudinal direction of the beam in each of the samples is indicated as a relative value with respect to the thermal conductivity in the longitudinal direction of the beam in the thermal-conductivity measurement reference sample.

Elastic-Modulus Measurement Sample 1-C

An elastic-modulus measurement sample 1-C was formed similarly to the elastic-modulus measurement sample 1-A except that the periodic interval P, the smallest dimension N of the solid portion of the beam layer in plan view, and the dimension d of the opening of each through hole were adjusted to 150 nm, 60 nm, and 90 nm, respectively.

Figure 11A:
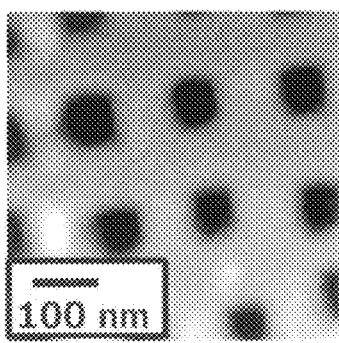
FIG. 11A is a scanning-probe-microscope (SPM) image of a sample before measurement of an elastic modulus.

Nanoindentation tests were sequentially performed at locations at the solid portion of the beam layer of the elastic-modulus measurement sample 1-C, and elastic moduli at these locations were determined. FIG. 11A is a SPM image indicating a surface of the elastic-modulus measurement sample Cl before the nanoindentation test. In the nanoindentation test, a diamond indenter was used. A tip portion of the diamond indenter was machined to have a radius of curvature of 40 nm. The diamond indenter was pressed into the surface of the beam layer such that it took five seconds for the load of the diamond indenter to reach a largest value of 20 µN in a load control mode. Thereafter, the load was kept at the largest value of 20 µN for five seconds, and the load was released such that it took five seconds for the load to decrease to 0 µN.

Figure 11B:
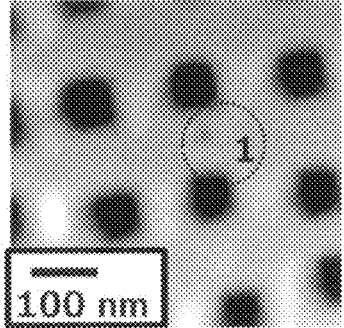
FIG. 11B is a SPM image indicating an elastic-modulus measurement location in the sample.
Figure 11C:
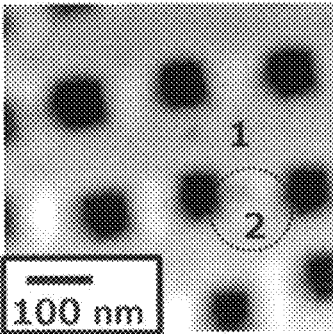
FIG. 11C is a SPM image indicating an elastic-modulus measurement location in the sample.
Figure 11D:
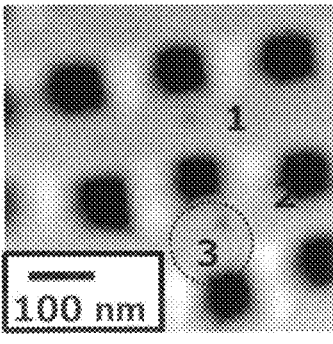
FIG. 11D is a SPM image indicating an elastic-modulus measurement location in the sample.

FIG. 11B is a SPM image indicating a measurement location in the first nanoindentation test at the solid portion of the beam layer. A location near the sign "1" surrounded by a circle of a dashed line corresponds to the measurement location. FIG. 11C is a SPM image indicating a measurement location in the second nanoindentation test at the solid portion of the beam layer. A location near the sign "2" surrounded by a circle of a dashed line corresponds to the measurement location. FIG. 11D is a SPM image indicating a measurement location in the third nanoindentation test at the solid portion of the beam layer. A location near the sign "3" surrounded by a circle of a dashed line corresponds to the measurement location. These measurement locations are positioned around an opening of, among through holes, a specific through hole. The elastic moduli of the solid portion of the beam layer at the measurement locations near the signs "1", "2", and "3" were 64.4 GPa, 52.3 GPa, and 53.8 GPa, respectively. As described above, it is understood that the values of the elastic moduli at the locations around the specific through hole among the through holes are not the same, and the elastic moduli differ from each other by more than or equal to 10% depending on the locations. It is understood that such non-uniformity of the elastic modulus of the beam layer that is a continuous body contributes to a reduction in the thermal conductivity of the beam layer.

Elastic-Modulus Measurement Sample 1-D

Figure 12A:
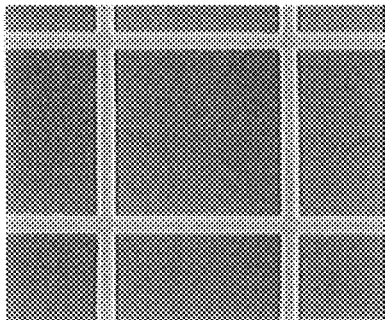
FIG. 12A is a scanning-electron-microscope (SEM) image of a sample.

An elastic-modulus measurement sample 1-D having a lattice shape was formed similarly to the elastic-modulus measurement sample 1-A except that the periodic interval P, the smallest dimension N of the solid portion of the beam layer in plan view, and the dimension d of the opening of each through hole were adjusted to 1297 nm, 104 nm, and 1193 nm, respectively. FIG. 12A is a SEM image indicating a surface of the elastic-modulus measurement sample 1-D.

Elastic-Modulus Measurement Sample 1-E

Figure 13A:
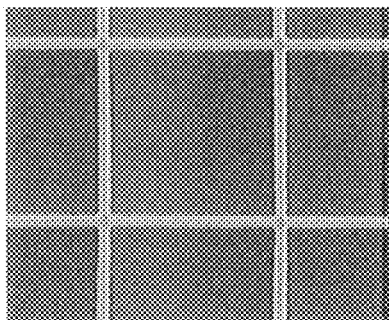
FIG. 13A is a SEM image of the sample.

An elastic-modulus measurement sample 1-E having a lattice shape was formed similarly to the elastic-modulus measurement sample 1-A except that the periodic interval P, the smallest dimension N of the solid portion of the beam layer in plan view, and the dimension d of the opening of each through hole were adjusted to 1259 nm, 67 nm, and 1192 nm, respectively. FIG. 13A is a SEM image indicating a surface of the elastic-modulus measurement sample 1-E.

Figure 12B:
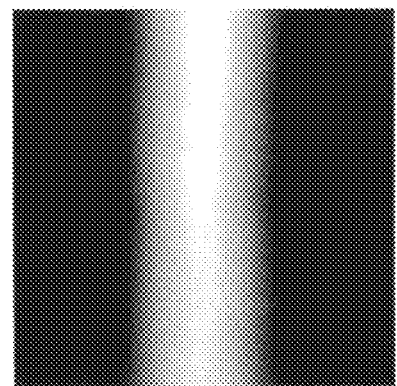
FIG. 12B is a SPM image indicating a state of an elastic-modulus measurement location in the sample before measurement.
Figure 12C:
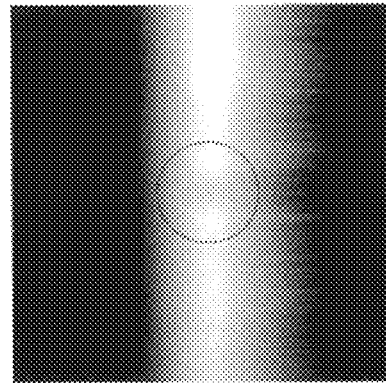
FIG. 12C is a SPM image indicating a state of the elastic-modulus measurement location in the sample after measurement.
Figure 13B:
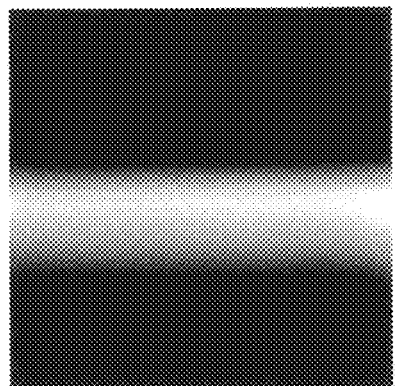
FIG. 13B is a SPM image indicating a state of the elastic-modulus measurement location in the sample before measurement.
Figure 13C:
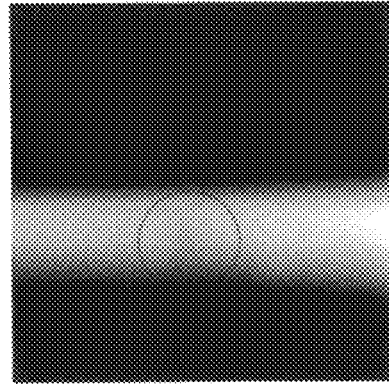
FIG. 13C is a SPM image indicating a state of the elastic-modulus measurement location in the sample after measurement.

Nanoindentation tests were performed at a specific location at the solid portion of each of the elastic-modulus measurement samples 1-D and 1-E, and an elastic modulus at the specific location was determined. FIG. 12B is a SPM image indicating a vicinity of a specific location in the elastic-modulus measurement sample 1-D before the nanoindentation test. FIG. 12C is a SPM image indicating the vicinity of the specific location in the elastic-modulus measurement sample 1-D after the nanoindentation test. In FIG. 12C, the specific location is surrounded by a circle of a dashed line. FIG. 13B is a SPM image indicating a vicinity of a specific location in the elastic-modulus measurement sample 1-E before the nanoindentation test. FIG. 13C is a SPM image indicating the vicinity of the specific location in the elastic-modulus measurement sample 1-E after the nanoindentation test. In FIG. 13C, the specific location is surrounded by a circle of a dashed line. A surface observation method using a SPM is advantageous in that it is possible to accurately visualize the position of an indentation that is formed by pressing of an indenter in a nanoindentation test.

As illustrated in FIG. 9, the elastic modulus of the solid portion of each of the samples in which the smallest dimension N of the solid portion of the beam layer in plan view is more than or equal to 150 nm does not significantly differ from the elastic modulus of the monocrystalline silicon that constitutes the beam layer of the elastic-modulus measurement reference sample. In addition, the thermal conductivity in the longitudinal direction of the beam of each of the samples in which the smallest dimension N of the solid portion of the beam in plan view is more than or equal to 150 nm does not significantly differ from the thermal conductivity in the longitudinal direction of the beam of the thermal-conductivity measurement reference sample. In contrast, the elastic modulus of the solid portion of the samples in which the smallest dimension N of the solid portion of the beam layer in plan view is less than or equal to 100 nm is lower than the elastic modulus of the monocrystalline silicon that constitutes the beam layer of the elastic-modulus measurement reference sample. For example, when the smallest dimension N of the solid portion of the beam layer of a sample in plan view is 40 nm, the elastic modulus of the solid portion of the sample is just 35% of the elastic modulus of the monocrystalline silicon that constitutes the beam layer of the elastic-modulus measurement reference sample. In addition, the thermal conductivity in the longitudinal direction of the beam of each of the samples in which the smallest dimension N of the solid portion of the beam in plan view is less than or equal to 100 nm is lower than the thermal conductivity in the longitudinal direction of the beam of the thermal-conductivity measurement reference sample. For example, when the smallest dimension N of the solid portion of the beam of a sample in plan view is 40 nm, the thermal conductivity in the longitudinal direction of the beam of the sample is just 41% of the thermal conductivity in the longitudinal direction of the beam of the thermal-conductivity measurement reference sample. Such results show that it is possible to adjust the elastic modulus, which is understood as a physical property value unique to a material, by adjusting the smallest dimension N of the solid portion in plan view. In addition, dependency of the elastic modulus of the solid portion on the smallest dimension N of the solid portion in plan view and dependency of the thermal conductivity in the longitudinal direction of the beam on the smallest dimension N of the solid portion in plan view show the same tendency. Therefore, it is understood that it is possible to adjust the thermal conductivity in the longitudinal direction of the beam by adjusting the elastic modulus of the solid portion.

As illustrated in FIG. 10, in the load-displacement curves obtained through the nanoindentation tests on the elastic-modulus measurement reference sample, the largest displacement amount was only 7.2 nm. Therefore, the elastic modulus of the monocrystalline silicon that constitutes the beam layer of the elastic-modulus measurement reference sample was 150 GPa. This value is close to the value of the elastic modulus of the bulk of the monocrystalline silicon. In contrast, in the load-displacement curves obtained through the nanoindentation tests on the elastic-modulus measurement sample 1-A, the largest displacement amount was 12.7 nm, and the elastic modulus at a specific location at the surface of the beam layer of this sample was 50 GPa. As described above, it is understood that the elastic modulus at a specific location at the surface of the beam layer of the elastic-modulus measurement sample 1-A decreases to approximately one third of a value that is close to the elastic modulus of the bulk of the monocrystalline silicon.

According to the results of the nanoindentation tests on the elastic-modulus measurement samples 1-D and 1-E, the elastic moduli at the specific locations in FIG. 12C and FIG. 13C were 63.8 GPa and 34.0 GPa, respectively. It is understood that the elastic modulus of a material can be adjust by micromachining.

The aforementioned evaluation results show that it is possible to adjust an elastic modulus, which is considered as a physical property value unique to a substance, by machining a material to a nanometer size and possible to adjust the thermal conductivity of the material by such adjustment of the elastic modulus. The aforementioned samples was possible by applying a material machining technique of a size of less than or equal to 100 nm, a technique of precisely evaluating the elastic modulus of a material, and a thermal-conductivity evaluation technique. It has been difficult to form such samples by conventional techniques. These techniques are useful as techniques for further enhancing the heat insulation performance of the infrared sensor.

For example, it is possible to form a p-type portion and an n-type portion by, for example, doping the beam of the thermal-conductivity measurement sample. It was confirmed that the elastic modulus of the solid portion of the beam layer is almost the same regardless of whether the beam layer was doped or not. For example, the elastic modulus of the solid portion of the beam layer of a sample that was formed similarly to the elastic-modulus measurement sample 1-A except that the beam layer was adjusted to an n-type by doping was 56.3 GPa. This elastic modulus is substantially the same as the elastic modulus of the solid portion of the beam layer of the elastic-modulus measurement sample 1-A.

Industrial Applicability

The infrared sensor according to the present disclosure is usable for various purposes including the purposes of infrared sensors.

What is claimed is:

1. An infrared sensor comprising:
   a base substrate;
   an infrared light receiver; and
   a beam,
   wherein the beam includes a separated portion that is separated from the base substrate so as to be suspended above the base substrate, and the beam is connected at the separated portion to the infrared light receiver,
   wherein the beam includes a p-type portion that contains a p-type semiconductor and an n-type portion that contains an n-type semiconductor,
   wherein the p-type portion has a first three-dimensional structure that includes first recesses and a first solid portion formed between the first recesses, the first solid portion having, between the first recesses adjacent to each other in plan view, a smallest dimension of less than or equal to 100 nanometers in plan view,
   wherein the n-type portion has a second three-dimensional structure that includes second recesses and a second solid portion formed between the second recesses, the second solid portion having, between the second recesses adjacent to each other in plan view, a smallest dimension of less than or equal to 100 nanometers in plan view, wherein each of the first recesses has two end portions, one end portion corresponds to an opening, and the other end portion opposite to the opening is closed, and wherein each of the second recesses has two end portions, one end portion corresponds to an opening, and the other end portion opposite to the opening is closed.

2. The infrared sensor according to claim 1, wherein the first solid portion includes a first portion and the second solid portion includes a second portion, and wherein the beam satisfies at least one of following conditions (Ib) or (IIb):

(Ib) the first portion of the first solid portion contains silicon and has a Young's modulus of less than or equal to 100 GPa; and (IIb) the second portion of the second solid portion contains silicon and has a Young's modulus of less than or equal to 100 GPa.

3. The infrared sensor according to claim 1, wherein the beam satisfies at least one of following conditions (Ic) or (IIc):

(Ic) the first recesses are circular in plan view of the first three-dimensional structure; and (IIc) the second recesses are circular in plan view of the second three-dimensional structure.

4. The infrared sensor according to claim 1, wherein the beam satisfies at least one of following conditions (Id) or (IId):

(Id) the first recesses are rectangular in plan view of the first three-dimensional structure; and (IId) the second recesses are rectangular in plan view of the second three-dimensional structure.

5. The infrared sensor according to claim 1, wherein the beam satisfies at least one following conditions (If) or (IIf):

(If) the first solid portion has, at locations around a specific one of the first recesses in plan view of the first three-dimensional structure, different first Young's moduli, and the first Young's moduli include a value whose difference from a largest value of the first Young's moduli is more than or equal to 10% of the largest value of the first Young's moduli; and (IIf) the second solid portion has, at locations around a specific one of the second recesses in plan view of the second three-dimensional structure, different second Young's moduli, and the second Young's moduli include a value whose difference from a largest value of the second Young's moduli is more than or equal to 10% of the largest value of the second Young's moduli.

6. The infrared sensor according to claim 1, wherein the infrared light receiver is a thermopile infrared light receiver, wherein the beam has a first region that has a first Seebeck coefficient, a second region that has a second Seebeck coefficient that differs from the first Seebeck coefficient, and a joint region to which the first region and the second region are joined, and wherein the infrared light receiver and the joint region are joined to each other.

7. The infrared sensor according to claim 6, wherein the beam is a single layer.

8. The infrared sensor according to claim 6, wherein the beam includes a base layer and a thermocouple layer that is disposed on the base layer, and wherein the thermocouple layer has the first region, the second region, and the joint region.

9. The infrared sensor according to claim 6, further comprising:

a first wire that is electrically connected to the first region;

a second wire that is electrically connected to the second region;

a first signal processing circuit that is electrically connected to the first wire; and a second signal processing circuit that is electrically connected to the second wire.

10. The infrared sensor according to claim 1, wherein the beam satisfies at least one of following conditions (Ia) or (IIa):

(Ia) the first solid portion includes a first portion having a Young's modulus of less than or equal to 80% of a Young's modulus of a first reference sample that is made of a material of a type identical to a type of a material constituting the first solid portion and that does not have recesses; and (IIa) the second solid portion includes a second portion having a Young's modulus of less than or equal to 80% of a Young's modulus of a second reference sample that is made of a material of a type identical to a type of a material constituting the second solid portion and that does not have recesses, and wherein a ratio of a depth of each of the first recesses to a dimension of the opening of each of the first recesses is more than or equal to 1 and less than or equal to 10, and a ratio of a depth of each of the second recesses to a dimension of the opening of each of the second recesses is more than or equal to 1 and less than or equal to 10.

11. An infrared sensor comprising:

a base substrate;

an infrared light receiver; and a beam, wherein the beam includes a separated portion that is separated from the base substrate so as to be suspended above the base substrate, and the beam is connected at the separated portion to the infrared light receiver, wherein the beam includes an electrical conductor, wherein the electrical conductor has a three-dimensional structure that includes recesses and a solid portion formed between the recesses, the solid portion having, between the recesses adjacent to each other in plan view, a smallest dimension of less than or equal to 100 nanometers in plan view, wherein each of the recesses has two end portions, one end portion corresponds to an opening, and the other end portion opposite to the opening is closed.

12. The infrared sensor according to claim 11, wherein the solid portion includes a portion, and the portion of the solid portion contains silicon and has a Young's modulus of less than or equal to 100 GPa.

13. The infrared sensor according to claim 11, wherein the recesses are circular in plan view of the three-dimensional structure.

14. The infrared sensor according to claim 11, wherein the recesses are rectangular in plan view of the three-dimensional structure.

15. The infrared sensor according to claim 11, wherein the solid portion has, at locations around a specific one of the recesses in plan view of the three-dimensional structure, different Young's moduli, and wherein the Young's moduli include a value whose difference from a largest value of the Young's moduli is more than or equal to 10% of the largest value.

16. The infrared sensor according to claim 11, wherein the infrared light receiver is a bolometer infrared light receiver, wherein the infrared sensor further comprises a first wire and a second wire that are electrically connected to the infrared light receiver, a first signal processing circuit that is electrically connected to the first wire, and a second signal processing circuit that is electrically connected to the second wire.

17. The infrared sensor according to claim 16, wherein the first wire has a first section between a connected portion at which the first wire is connected to the infrared light receiver and the first signal processing circuit, the first section being separated from the base substrate, wherein the second wire has a second section between a connected portion at which the second wire is connected to the infrared light receiver and the second signal processing circuit, the second section being separated from the base substrate, and wherein the beam has the three-dimensional structure at the first section and the second section.

18. The infrared sensor according to claim 16, wherein the first wire has a first section between a connected portion at which the first wire is connected to the infrared light receiver and the first signal processing circuit, the first section being separated from the base substrate, wherein the second wire has a second section between a connected portion at which the second wire is connected to the infrared light receiver and the second signal processing circuit, the second section being separated from the base substrate, and wherein the first section and the second section are in contact with a surface of the beam.

19. The infrared sensor according to claim 16, wherein the first wire has a first section between a connected portion at which the first wire is connected to the infrared light receiver and the first signal processing circuit, the first section being separated from the base substrate, wherein the second wire has a second section between a connected portion at which the second wire is connected to the infrared light receiver and the second signal processing circuit, the second section being separated from the base substrate, and wherein at least one of the first section or the second section has a phononic crystal structure.

20. The infrared sensor according to claim 11, wherein the solid portion includes a portion having a Young's modulus of less than or equal to 80% of a Young's modulus of a reference sample that is made of a material of a type identical to a type of a material constituting the solid portion and that does not have recesses, and wherein a ratio of a depth of each of the recesses to a dimension of the opening of each of the recesses is more than or equal to 1 and less than or equal to 10.

* * * * *